(12) United States Patent
Kim et al.

(10) Patent No.: US 12,364,109 B2
(45) Date of Patent: Jul. 15, 2025

(54) DISPLAY DEVICE AND METHOD FOR MANUFACTURING THE SAME

(71) Applicant: Samsung Display Co., LTD., Yongin-si (KR)

(72) Inventors: Ji Yoon Kim, Seongnam-si (KR); Chang Hee Lee, Seoul (KR); Dong Hoon Kwak, Hwaseong-si (KR); Young Mo Koo, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 566 days.

(21) Appl. No.: 17/746,444

(22) Filed: May 17, 2022

(65) Prior Publication Data

US 2023/0110744 A1    Apr. 13, 2023

(30) Foreign Application Priority Data

Oct. 13, 2021    (KR) .................. 10-2021-0135924

(51) Int. Cl.
*H01L 27/32* (2006.01)
*H10K 50/16* (2023.01)
(Continued)

(52) U.S. Cl.
CPC ........... *H10K 59/122* (2023.02); *H10K 50/16* (2023.02); *H10K 50/171* (2023.02); *H10K 71/00* (2023.02); *H10K 50/81* (2023.02); *H10K 50/82* (2023.02); *H10K 59/1201* (2023.02); *H10K 2102/101* (2023.02)

(58) Field of Classification Search
CPC .... H10K 59/122; H10K 50/16; H10K 50/171; H10K 71/00; H10K 50/81; H10K 50/82; H10K 59/1201; H10K 2102/101; H10K 59/80521; H10K 50/822; H10K 59/1315;
(Continued)

(56) References Cited

U.S. PATENT DOCUMENTS 9,076,983 B2    7/2015 Kim et al.
10,319,935 B2    6/2019 Nishimura et al.
(Continued)

FOREIGN PATENT DOCUMENTS

EP         3 766 100        1/2021
KR    10-2015-0075017       7/2015
(Continued)

OTHER PUBLICATIONS

Kunsik AN et al., "Germinant ZnO nanorods as a charge-selective layer in organic solar cells", Journal of Materials Science & Technology, 2020, pp. 89-94, vol. 55.
(Continued)

*Primary Examiner* — Mohammed R Alam
(74) *Attorney, Agent, or Firm* — KILE PARK REED & HOUTTEMAN PLLC

(57) ABSTRACT

A display device includes an auxiliary electrode disposed on a substrate, a bank layer disposed on the auxiliary electrode, a conductive layer disposed on the auxiliary electrode, the conductive layer including a base portion and protrusions protruded from the base portion, an organic layer disposed on the conductive layer, and a cathode electrode disposed on the organic layer, the cathode electrode being in contact with the protrusions.

15 Claims, 29 Drawing Sheets

(51) Int. Cl.
*H10K 50/17* (2023.01)
*H10K 59/122* (2023.01)
*H10K 71/00* (2023.01)
H10K 50/81 (2023.01)
H10K 50/82 (2023.01)
H10K 59/12 (2023.01)
H10K 102/10 (2023.01)

(58) Field of Classification Search
CPC ......... H10K 2102/3026; H10K 50/824; H10K 50/814; H10K 50/15; H10K 50/813
See application file for complete search history.

(56) References Cited

U.S. PATENT DOCUMENTS

| | | |
|---|---|---|
| 11,335,877 B2 | 5/2022 | Wang et al. |
| 2012/0228592 A1 | 9/2012 | Yokoyama et al. |
| 2014/0346453 A1 | 11/2014 | Koo et al. |
| 2018/0190672 A1* | 7/2018 | Lee ........................ H10D 86/60 |
| 2020/0135772 A1* | 4/2020 | Lee ...................... H10K 59/131 |

FOREIGN PATENT DOCUMENTS

| | | |
|---|---|---|
| KR | 10-2016-0072372 | 6/2016 |
| KR | 10-2017-0078969 | 7/2017 |
| KR | 10-2021-0055422 | 5/2021 |

OTHER PUBLICATIONS

Extended European Search Report for European Patent Application or Patent No. 22198544.3 dated Feb. 22, 2023.

\* cited by examiner

DISPLAY DEVICE AND METHOD FOR MANUFACTURING THE SAME

CROSS-REFERENCE TO RELATED APPLICATION(S)

This application claims priority to and benefits of Korean Patent Application No. 10-2021-0135924 under 35 U.S.C. 119, filed on Oct. 13, 2021 in the Korean Intellectual Property Office (KIPO), the entire contents of which are herein incorporated by reference.

BACKGROUND

1. Technical Field

The disclosure relates to a display device and a method for manufacturing the same.

2. Description of the Related Art

With the advancement of the information age, the demand for display devices for displaying images has increased in various forms. For example, display devices have been applied to various electronic devices such as smart phones, a digital cameras, notebook computers, navigators, and smart televisions.

A display device may be a flat panel display device such as a liquid crystal display device, a field emission display device, or a light emitting display device. A light emitting display device may be an organic light emitting display device that may include an organic light emitting diode, an inorganic light emitting display device that may include an inorganic light emitting diode such as an inorganic semiconductor, or a micro light emitting display device that may include a micro light emitting diode.

An organic light emitting diode may include an anode electrode and a cathode electrode, which face each other, and a light emitting layer interposed between the anode electrode and the cathode electrode. The light emitting layer may generate excitons by recombination of electrons and holes received from the anode and cathode electrodes, and may change the generated excitons from an excited state to a ground state to emit light.

The organic light emitting diode may include a cathode electrode that may be thin to emit light upwardly. Such a thin cathode electrode may cause a problem such as a voltage drop, whereby efforts to solve the voltage drop problem of the cathode electrode will be required.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An aspect of the disclosure is to provide a display device and a method for manufacturing the same, in which a voltage drop problem of a cathode electrode may be solved by a readily performable process.

Aspects of the disclosure are not limited to those mentioned above and additional aspects of the disclosure, which are not mentioned herein, will be clearly understood by those skilled in the art from the following description of the disclosure.

According to an embodiment of the disclosure, a display device may include an auxiliary electrode disposed on a substrate, a bank layer disposed on the auxiliary electrode, a conductive layer disposed on the auxiliary electrode, the conductive layer including a base portion and protrusions protruded from the base portion, an organic layer disposed on the conductive layer, and a cathode electrode disposed on the organic layer, the cathode electrode being in contact with the protrusions.

In an embodiment, the base portion may be extended in a first direction parallel to the substrate, and the protrusions may be extended in a second direction intersecting the first direction.

In an embodiment, the protrusions may be in a rod shape.

In an embodiment, the base portion and the protrusions may be in a single body, and the base portion and the protrusions may include a same material.

In an embodiment, the base portion and the protrusions may include zinc oxide.

In an embodiment, a length of the protrusions may be about 500 Å or more, and a length of the protrusions may be smaller than a thickness of the bank layer.

In an embodiment, the protrusions may be randomly disposed in a plan view.

In an embodiment, the organic layer may include at least one of an electron transport layer and an electron injection layer.

In an embodiment, the organic layer may be in contact with an upper surface of each of the base portion and the protrusions.

In an embodiment, the cathode electrode may be in contact with sides of the protrusions.

In an embodiment, the bank layer may include an opening that exposes the auxiliary electrode, and the conductive layer may be disposed in the opening.

In an embodiment, at least a portion of the base portion may be disposed below the bank layer, and at least a portion of the base portion may overlap the bank layer in a plan view.

In an embodiment, the conductive layer may be disposed in dot shapes in a plan view.

According to an embodiment of the disclosure, a display device may include an anode electrode disposed on a light emission area of a substrate and an auxiliary electrode disposed on a non-light emission area of the substrate, a bank layer disposed on the anode electrode and the auxiliary electrode, a conductive layer disposed on the auxiliary electrode, the conductive layer including a base portion and protrusions protruded from the base portion, an organic layer disposed on the anode electrode and the conductive layer, and a cathode electrode disposed on the organic layer, the cathode electrode being in contact with the protrusions.

In an embodiment, the anode electrode and the auxiliary electrode may be disposed on a same layer, and the anode electrode and the auxiliary electrode may include a same material.

In an embodiment, the organic layer may include a hole injection layer, a hole transport layer, a light emitting layer, an electron transport layer, and an electron injection layer. The hole injection layer, the hole transport layer, the light emitting layer, the electron transport layer, and the electron injection layer may overlap the anode electrode in a plan view, and the hole injection layer, the hole transport layer, and the light emitting layer may not overlap the conductive layer in a plan view, and the electron transport layer and the electron injection layer may overlap the conductive layer in a plan view.

In an embodiment, the base portion and the protrusions may be in a single body, and the cathode electrode may be in contact with sides of the protrusions.

According to an embodiment of the disclosure, a method for manufacturing a display device may be provided. The method may include forming an auxiliary electrode on a substrate, forming a bank layer, which exposes the auxiliary electrode, on the auxiliary electrode, forming a base portion of a conductive layer by spraying a seed ink onto the auxiliary electrode to form a base portion of the conductive layer, growing protrusions from the base by spraying a precursor ink onto the base portion, forming an organic layer on the protrusions, and forming a cathode electrode on the organic layer.

In an embodiment, the seed ink may include zinc acetate dihydrate, and the precursor ink may include zinc nitrate hexahydrate.

In an embodiment, the forming the base portion of the conductive layer may include performing drying and bake processes after spraying the seed ink.

In an embodiment, the growing the protrusions may include reacting a seed of the base portion with the precursor ink to grow the protrusions, and adjusting a reaction time to adjust a length of the protrusions.

In an embodiment, the precursor ink may be removed by performing drying and bake processes after the protrusions may be grown.

In an embodiment, the organic layer may be formed by a deposition method, and the cathode electrode may be formed by a sputtering or deposition method.

In a display device and a method for manufacturing the same according to the embodiments, protrusions may be grown on an auxiliary electrode to form a conductive layer, whereby a contact area between a cathode electrode and the conductive layer may be increased to lower resistance of the cathode electrode and solve a voltage drop problem.

Therefore, since the contact area between the cathode electrode and the conductive layer may be increased in a limited size on a plane of the auxiliary electrode, an aperture ratio may be prevented from being reduced due to the auxiliary electrode.

Also, in the method for manufacturing a display device according to the embodiments, in order to electrically connect the auxiliary electrode with the cathode electrode, a process for removing an organic layer may be omitted.

The effects according to the embodiments of the disclosure are not limited to those mentioned above and additional effects are included in the following description of the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
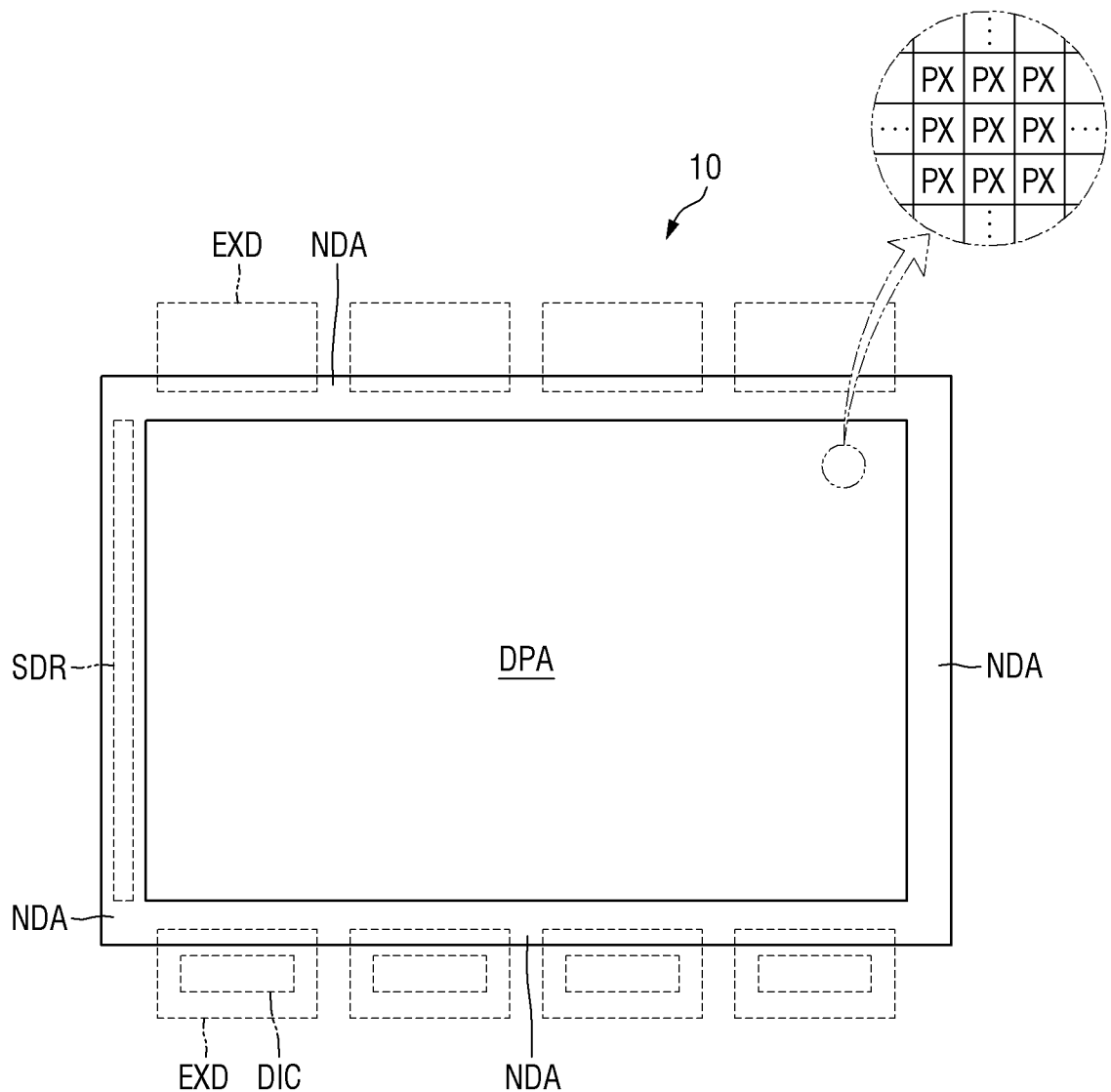
FIG. 1 is a schematic plan view illustrating a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or to "not overlap" another element, this may include that the elements are spaced apart from each other, offset from each other, or set aside from each other or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that the terms "connected to" or "coupled to" may include a physical or electrical connection or coupling.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device according to an embodiment of the disclosure.

Referring to FIG. 1, a display device 10 according to an embodiment may be applied to a smartphone, a cellular phone, a tablet PC, a personal digital assistant (PDA), a portable multimedia player (PMP), a television, a game machine, a wristwatch type electronic device, a head mounted display, a monitor of a personal computer, a notebook computer, a vehicle navigator, a vehicle dashboard, a digital camera, a camcorder, an external billboard, an electronic display board, a medical device, an inspection device, various home appliances such as a refrigerator and a washing machine, or a device for Internet of Things. In the disclosure, a television (TV) will be described as an example of a display device, and the TV may have high resolution (ultra-high resolution such as HD, UHD, 4K and 8K).

The display device 10 according to embodiments may be categorized variously depending on a display method. For example, the display device may include an organic light emitting display (OLED) device, an inorganic light emitting display device, a quantum dot light emitting display (QED) device, a micro-LED display device, a nano-LED display device, a plasma display device (PDP), a field emission display (FED) device, a cathode ray tube (CRT) device, a liquid crystal display (LCD) device, or an electrophoretic display (EPD) device. Hereinafter, the organic light emitting display device will be described as the display device by way of example, and the organic light emitting display device applied to the embodiments will simply be abbreviated as the display device unless required to be specially classified. However, the embodiments are not limited to the organic light emitting display device, and another display device listed above or otherwise in the art may be applied to the embodiments.

The display device 10 according to an embodiment of the disclosure may have a square shape on a plan view, and may have a rectangular shape, for example. In case that the display device 10 is a television, the display device 10 may be disposed such that a long side may be positioned in a horizontal direction, but the disclosure is not limited thereto. The display device 10 may be disposed such that the long side may be positioned in a vertical direction, or may rotatably be arranged such that the long side may be variably positioned in a horizontal or vertical direction.

The display device 10 may include a display area DPA and a non-display area NDA. The display area DPA may be an active area where an image may be displayed. The display area DPA may have a rectangular shape on a plan view, which may be similar to a general shape of the display device 10, but is not limited thereto.

The display area DPA may include pixels PX. The pixels PX may be arranged in a matrix direction. A shape of each pixel PX may be a rectangular or square shape on a plan view, but is not limited thereto. Each pixel may have a rhombus shape in which each side may be inclined with respect to one side direction of the display device 10. The pixels PX may include color pixels PX. For example, the pixels PX may include, but are not limited to, a first red color pixel PX, a second green color pixel PX, and a third blue color pixel PX. The respective color pixels PX may alternately be arranged in a stripe type or PenTile® type arrangement.

The non-display area NDA may be disposed near the display area DPA. The non-display area NDA may fully or partially surround the display area DPA. The display area DPA may be rectangular in shape, and the non-display area NDA may be disposed to be adjacent to four sides of the display area DPA. The non-display area NDA may constitute a bezel of the display device 10.

A driving circuit or driving element for driving the display area DPA may be disposed in the non-display area NDA. In an embodiment, a pad area may be provided on a display substrate of the display device 10 in a first non-display area NDA disposed to be adjacent to a first long side (lower side in FIG. 1) of the display device 10 and a second non-display area NDA disposed to be adjacent to a second long side (upper side in FIG. 1) of the display device 10, and an external device EXD may be packaged on a pad electrode of the pad area. Examples of the external device EXD may include a connection film, a printed circuit board, a driving chip (DIC), a connector, and a wiring connection film. A scan driver SDR, which may be directly formed on the display substrate of the display device 10, may be disposed in a third non-display area NDA disposed to be adjacent to a first short side (left side in FIG. 1) of the display device 10.

Figure 2:
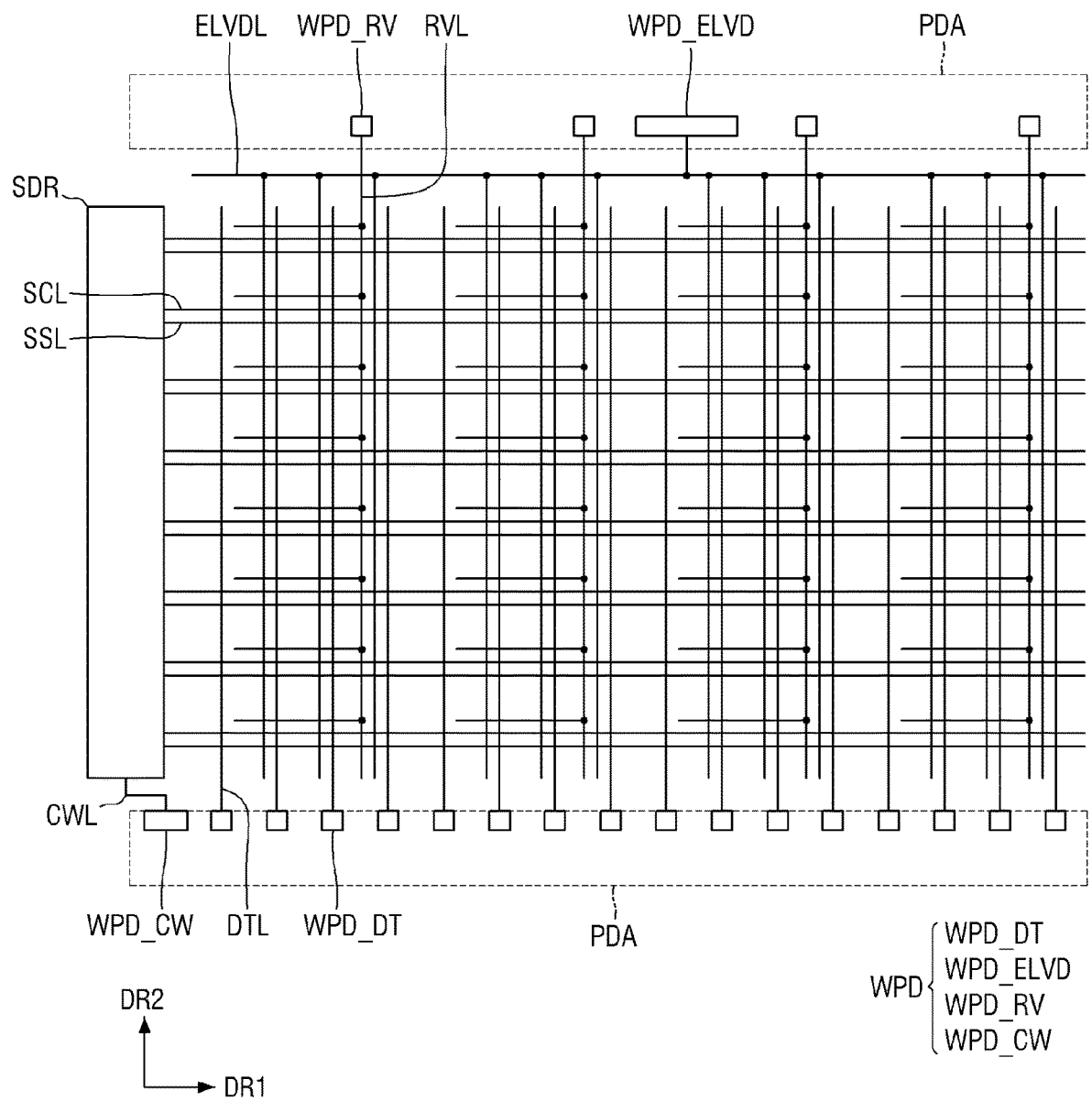
FIG. 2 is a schematic layout view illustrating a circuit of a first substrate of a display device according to an embodiment of the disclosure.

FIG. 2 is a schematic layout view illustrating a circuit of a first substrate of a display device according to an embodiment of the disclosure.

Referring to FIG. 2, wires may be disposed on the first substrate. The wires may include a scan line SCL, a sensing signal line SSL, a data line DTL, a reference voltage line RVL, and a first power line ELVDL.

The scan line SCL and the sensing signal line SSL may be extended in a first direction DR1. The scan line SCL and the sensing signal line SSL may be connected to the scan driver SDR. The scan driver SDR may include a driving circuit comprised of a circuit layer. The scan driver SDR may be disposed in the third non-display area NDA on the first substrate, but is not limited thereto. The scan driver SDR may be disposed in a fourth non-display area NDA, or may be disposed in both the third non-display area NDA and the fourth non-display area NDA. The scan driver SDR may be connected to a signal connection line CWL, and at least one end of the signal connection line CWL may be connected to an external device ('EXD' of FIG. 1) by forming a pad WPD_CW on the first non-display area NDA and/or the second non-display area NDA.

The data line DTL and the reference voltage line RVL may be extended in a second direction DR2 crossing the first direction DR1. The first power line ELVDL may include a portion extended in the second direction DR2. The first power line ELVDL may further include a portion extended in the first direction DR1. The first power line ELVDL may have a mesh structure, but is not limited thereto.

A wiring pad WPD may be disposed on at least one end of the data line DTL, the reference voltage line RVL and the first power line ELVDL. Each wiring pad WPD may be disposed in a pad area PDA of the non-display area NDA. In an embodiment, a wiring pad WPD_DT (hereinafter, referred to as 'data pad') of the data line DTL may be disposed in the pad area PDA of the first non-display area NDA, and a wiring pad WPD_RV (hereinafter, referred to as 'reference voltage pad') of the reference voltage line RVL and a wiring pad WPD_ELVD (hereinafter, referred to as 'first power pad') of the first power line ELVDL may be disposed in a pad area PDA of the second non-display area NDA. As another example, the data pad WPD_DT, the reference voltage pad WPD_RV and the first power pad WPD_ELVD may be disposed in the same area, for example, the first non-display area NDA. As described above, the external device ('EXD' of FIG. 1) may be packaged on the wiring pad WPD. The external device EXD may be packaged on the wiring pad WPD through an anisotropic conductive film, an ultrasonic bonding or the like.

Each pixel PX on the first substrate may include a pixel driving circuit. The above-described lines may apply a driving signal to each pixel driving circuit while passing through each pixel PX or its periphery. The pixel driving circuit may include a transistor and a capacitor. Various modifications may be made in the number of transistors and capacitors of each pixel driving circuit. Hereinafter, the pixel driving circuit will be described based on a 3T1C structure that includes three transistors and one capacitor, but is not limited thereto. Various modified pixel structures such as a 2T1C structure, a 7T1C structure and a 6T1C structure may be applied to the pixel driving circuit.

Figure 3:
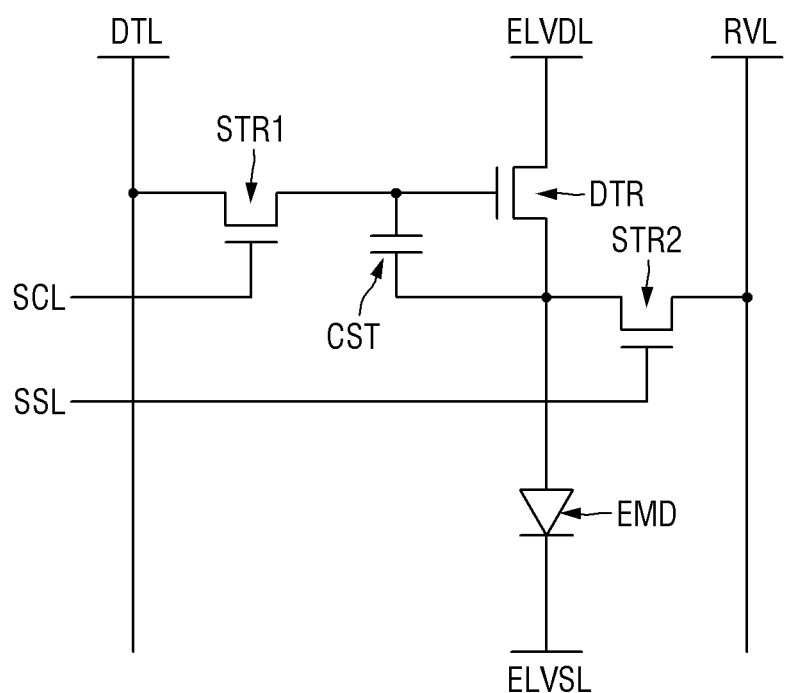
FIG. 3 is a schematic equivalent circuit view illustrating a pixel of a display device according to an embodiment of the disclosure.

FIG. 3 is a schematic equivalent circuit view illustrating a pixel of a display device according to an embodiment of the disclosure.

Referring to FIG. 3, each pixel PX of the display device according to an embodiment may include three transistors DTR, STR1 and STR2 and a storage capacitor CST in addition to a light emitting diode EMD.

The light emitting diode EMD may emit light depending on a current supplied through the driving transistor DTR. The light emitting diode EMD may be implemented as an organic light emitting diode (OLED), a micro light emitting diode, a nano light emitting diode and the like.

A first electrode (i.e., anode electrode) of the light emitting diode EMD may be connected to a source electrode of the driving transistor DTR, and a second electrode (i.e., cathode electrode) may be connected to a second power line ELVSL supplied with a low potential voltage (second power voltage) lower than a high potential voltage (first power voltage) of the first power line ELVDL.

The driving transistor DTR may adjust the current flowing from the first power line ELVDL supplied with the first power voltage to the light emitting diode EMD in accordance with a voltage difference between a gate electrode and the source electrode. The gate electrode of the driving transistor DTR may be connected to a first source/drain electrode of the first switching transistor STR1, its source electrode may be connected to the first electrode of the light emitting diode EMD, and its drain electrode may be connected to the first power line ELVDL to which the first power voltage may be applied.

The first switching transistor STR1 may be turned on by a scan signal of the scan line SCL to connect the data line DTL to the gate electrode of the driving transistor DTR. A gate electrode of the first switching transistor STR1 may be connected to the scan line SCL, its first source/drain electrode may be connected to the gate electrode of the driving transistor DTR, and its second source/drain electrode may be connected to the data line DTL.

The second switching transistor STR2 may be turned on by a sensing signal of the sensing signal line SSL to connect the reference voltage line RVL to the source electrode of the driving transistor DTR. A gate electrode of the second switching transistor STR2 may be connected to the sensing signal line SSL, its first source/drain electrode may be connected to the reference voltage line RVL and its second source/drain electrode may be connected to the source electrode of the driving transistor DTR.

In an embodiment, the first source/drain electrode of each of the first and second switching transistors STR1 and STR2 may be a source electrode and the second source/drain electrode thereof may be a drain electrode, but the disclosure is not limited thereto and may be vice versa.

The capacitor CST may be formed between the gate electrode and the source electrode of the driving transistor DTR. The storage capacitor CST may store a difference voltage of a gate voltage and a source voltage of the driving transistor DTR.

The driving transistor DTR and the first and second switching transistors STR1 and STR2 may be formed of thin film transistors. In FIG. 3, the driving transistor DTR and the first and second switching transistors STR1 and STR2 may be N-type metal oxide semiconductor field effect transistors (MOSFETs), but are not limited thereto. For example, the driving transistor DTR and the first and second switching transistors STR1 and STR2 may be P-type MOSFETs, or a portion thereof may be N-type MOSFET and another portion thereof may be P-type MOSFET.

Figure 4:
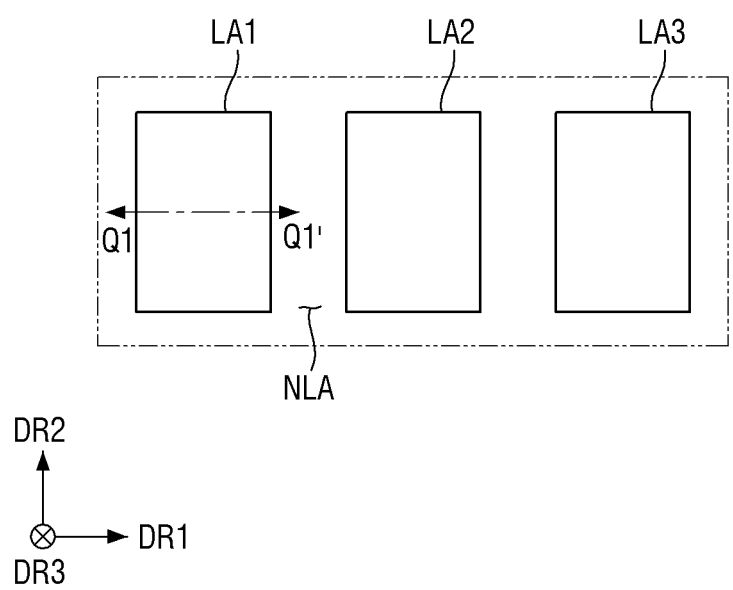
FIG. 4 is a schematic plan view illustrating a pixel of an organic light emitting display device according to an embodiment of the disclosure.
Figure 5:
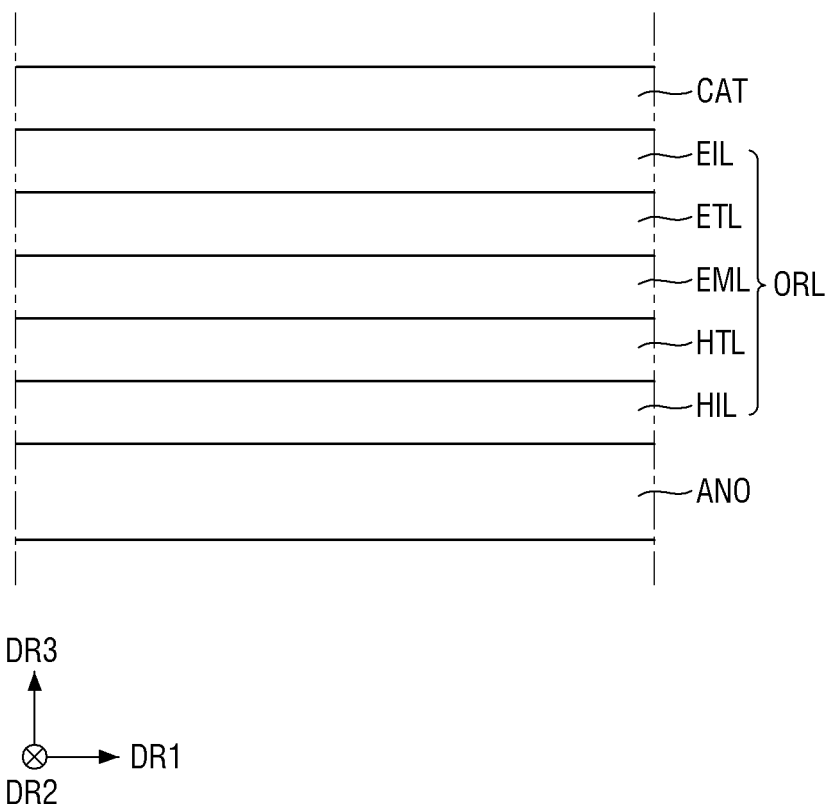
FIG. 5 is a schematic cross-sectional view taken along line Q1-Q1' of FIG. 4.

FIG. 4 is a schematic plan view illustrating a pixel of an organic light emitting display device according to an embodiment of the disclosure. FIG. 5 is a schematic cross-sectional view taken along line Q1-Q1' of FIG. 4.

Referring to FIG. 4, light emission areas LA1, LA2, LA3 and a non-light emission area NLA may be defined on the substrate in the display area DPA. In some embodiments, the light emission areas LA1, LA2 and LA3 of the display area DPA may include a first light emission area LA1, a second light emission area LA2 and a third light emission area LA3. The first light emission area LA1, the second light emission area LA2 and the third light emission area LA3 may be areas where light generated by the light emitting diode of the substrate may be emitted to the outside, and the non-light emission area NLA may be an area where light may not be emitted to the outside.

In some embodiments, the first light emission area LA1, the second light emission area LA2 and the third light emission area LA3 may emit light of different colors to the outside. For example, the first light emission area LA1 may emit light of a first color, the second light emission area LA2 may emit light of a second color, and the third light emission area LA3 may emit light of a third color. The light of the first color may be blue light having a peak wavelength in the range of about 440 nm to about 480 nm. The light of the second color may be red light having a peak wavelength in the range of about 610 nm to about 650 nm. The light of the third color may be green light having a peak wavelength in the range of about 510 nm to about 550 nm. However, the disclosure is not limited to these examples, and the light of the second color may be green light and the light of the third color may be red light.

In some embodiments, the first light emission area LA1, the second light emission area LA2 and the third light emission area LA3 may form one group, and multiple groups may be disposed in the display area DPA.

In some embodiments, as shown in FIG. 4, the first light emission area LA1, the second light emission area LA2 and the third light emission area LA3 may sequentially be disposed along a direction. In some embodiments, the first light emission area LA1, the second light emission area LA2 and the third light emission area LA3 may repeatedly be disposed in the display area DPA by forming one group.

However, the disclosure is not limited to the above example. Various modifications may be made in the arrangement of the first light emission area LA1, the second light emission area LA2 and the third light emission area LA3.

Referring to FIG. 5, an anode electrode ANO, an organic layer ORL and a cathode electrode CAT may be disposed in the first light emission area LA1. In FIG. 5, the first light emission area LA1 will be described by way of example, but the disclosure is not limited thereto, and the description of the first light emission area LA1 may equally be applied to the second and third light emission areas LA2 and LA3.

The anode electrode ANO may be a reflective electrode. The anode electrode ANO may include a reflective layer and a metal oxide layer stacked on the reflective layer. In an embodiment, the anode electrode ANO may have a multi-layered structure, for example, a two-layered structure such as ITO/Ag, Ag/ITO, ITO/Mg and ITO/MgF$_2$ or a three-layered structure such as ITO/Ag/ITO.

The organic layer ORL may include functional layers. In detail, the organic layer ORL may include a hole injection layer HIL, a hole transport layer HTL, a light emitting layer EML, an electron transport layer ETL, and an electron injection layer EIL.

The hole injection layer HIL may be disposed directly on the anode electrode ANO. The hole injection layer HIL may serve to inject holes into the light emitting layer EML more actively. In some embodiments, the hole injection layer HIL may be formed of at least one selected from a group consisting of copper phthalocyanine (CuPc), poly(3,4)-ethylenedioxythiophene (PEDOT), polyaniline (PANT) and N,N-dinaphthyl-N,N'-diphenyl benzidine (NPD).

The hole transport layer HTL may be disposed on the hole injection layer HIL. The hole transport layer HTL may serve to facilitate transport of holes, and may include a hole transport material. The hole transport material may include, but is not limited to, a carbazole-based derivative such as N-phenylcarbazole and polyvinylcarbazole, a fluorene-based derivative, a triphenylamine-based derivative such as N,N'-bis(3-methylphenyl)-N,N'-diphenyl-[1,1-biphenyl]-4,4'-diamine (TPD) and 4,4',4''-tris(N-carbazolyl)triphenylamine (TCTA), N,N'-di(1-naphthyl)-N,N'-diphenylbenzidine (NPB), 4,4'-Cyclohexylidene bis[N,N-bis(4-methylphenyl)benzenamine] (TAPC), etc.

The light emitting layer EML may be disposed on the hole transport layer HTL. The light emitting layer EML may emit light of different colors for each of the light emission areas LA1, LA2 and LA3. For example, the light emitting layer EML of the first light emission area LA1 may emit light of a first color, for example, blue light. The light emitting layer EML of the second light emission area LA2 may emit light of a second color, for example, red light. The light emitting layer EML of the third light emission area LA3 may emit light of a third color, for example, green light.

In some embodiments, the light emitting layer EML for emitting blue light may include a host and a dopant. There is no special limitation in the material of the host in case that the material of the host is generally used. For example, Alq3(tris(8-hydroxyquinolino)aluminum), CBP(4,4'-bis(N-carbazolyl)-1,1'-biphenyl), PVK(poly(n-vinylcabazole)), ADN(9,10-di(naphthalene-2-yl)anthracene), TCTA(4,4',4''-Tris(carbazol-9-yl)-triphenylamine), TPBi(1,3,5-tris(N-phenylbenzimidazole-2-yl)benzene), TBADN(3-tert-butyl-9,10-di(naphth-2-yl)anthracene), DSA(distyrylarylene), CDBP(4,4'-bis(9-carbazolyl)-2,2''-dimethyl-biphenyl), or MADN(2-Methyl-9,10-bis(naphthalen-2-yl)anthracene) may be used as the host.

The light emitting layer EML for emitting blue light may include, for example, a fluorescent material that includes at least one selected from a group consisting of spiro-DPVBi, spiro-6P, distyryl-benzene (DSB), distyryl-arylene (DSA), Polyfluorene (PFO)-based polymer and poly(p)-phenylene vinylene (PPV). As another example, the light emitting layer EML for emitting blue light may include a phosphorescent material that includes an organometallic complex such as (4,6-F2ppy)2Irpic.

In some embodiments, the light emitting layer EML for emitting red light may include a host material that includes carbazole biphenyl (CBP) or 1,3-bis (carbazole-9-yl) (mCP), and may be made of a phosphorescent material that includes at least one selected from a group consisting of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP (octaethylporphyrin platinum). In other embodiments, the light emitting layer EML for emitting red light may be made of a fluorescent material that includes PBD:Eu(DBM)$_3$(Phen) or Perylene, but is not limited thereto.

In some embodiments, the light emitting layer EML for emitting green light may include a host material that includes CBP or mCP, and may be made of a phosphorescent material that includes a dopant material containing Ir(ppy)3(fac tris(2-phenylpyridine)iridium), but is not limited thereto. In other embodiments, the light emitting layer EML for emitting green line may be made of a fluorescent material that includes Alq3(tris(8-hydroxyquinolino)aluminum), but is not limited thereto.

The disclosure is not limited to the above examples, and the light emitting layers EML of the respective light emission areas LA1, LA2 and LA3 may emit light of the same color. For example, the light emitting layer EML may emit blue light of a first color or emit white light of a fourth color.

The electron transport layer ETL may be disposed on the light emitting layer EML. The electron transport layer ETL may include an electron transport material such as Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminum), Bebq2(berylliumbis(benzoquinolin-10-olate), ADN(9,10-di(naphthalene-2-yl)anthracene) and their mixture. However, the disclosure is not limited to the above types of the electron transport material.

The electron injection layer EIL may be disposed on the electron transport layer ETL. The electron injection layer EIL may serve to facilitate the injection of electrons, and Alq3(tris(8-hydroxyquinolino)aluminum), PBD, TAZ, Spiro-PBD, BAlq or SAlq may be used as the electron injection layer EIL, but the electron injection layer EIL is not limited to these examples. The electron injection layer may be a metal halide compound, and may be at least one selected from a group consisting of, for example, MgF$_2$, LiF, NaF, KF, RbF, CsF, FrF, LiI, NaI, KI, RbI, CsI, FrI and CaF$_2$, but is not limited thereto. Also, the electron injection layer EIL may include a lanthanum-based material such as Yb, Sm, Eu, etc. In other embodiments, the electron injection layer EIL may include a metal halide material and a lanthanum-based material at the same time, such as RbI:Yb and KI:Yb. In case that the electron injection layer EIL includes both the metal halide material and the lanthanum-based material, the electron injection layer may be formed by co-depositing the metal halide material and the lanthanum-based material.

The cathode electrode CAT may be disposed on the organic layer ORL described above. The cathode electrode CAT may have permeability. In case that the cathode electrode CAT has permeability, it may include Ag, Mg, Cu, Al, Pt, Pd, Au, Ni, Nd, Ir, Cr, Li, Ca, LiF/Ca, LiF/Al, Mo, Ti, or their compound or mixture such as mixture of Ag and Mg. Also, in case that the cathode electrode CAT has a thickness ranging from several tens to hundreds of angstroms, the cathode electrode CAT may have semi-permeability. The cathode electrode CAT may also include a transparent conductive oxide (TCO). For example, the cathode electrode CAT may include tungsten oxide (WxOy), titanium oxide (TiO$_2$), indium tin oxide (ITO), indium zinc oxide (IZO), zinc oxide (ZnO), indium tin zinc oxide (ITZO), magnesium oxide (MgO), and the like.

The cathode electrode CAT may be disposed entirely on the display area DPA. The cathode electrode CAT may be formed to be thin in the range of several tens to hundreds of angstroms, so that permeability may be obtained to allow light to be emitted to an upper portion of the cathode electrode CAT. A drop of a voltage that may be applied may occur due to such a thin cathode electrode CAT. Hereinafter, according to an embodiment of the disclosure, an organic light emitting display device that solves a voltage drop problem of the cathode electrode CAT and facilitates a process will be described.

Figure 6:
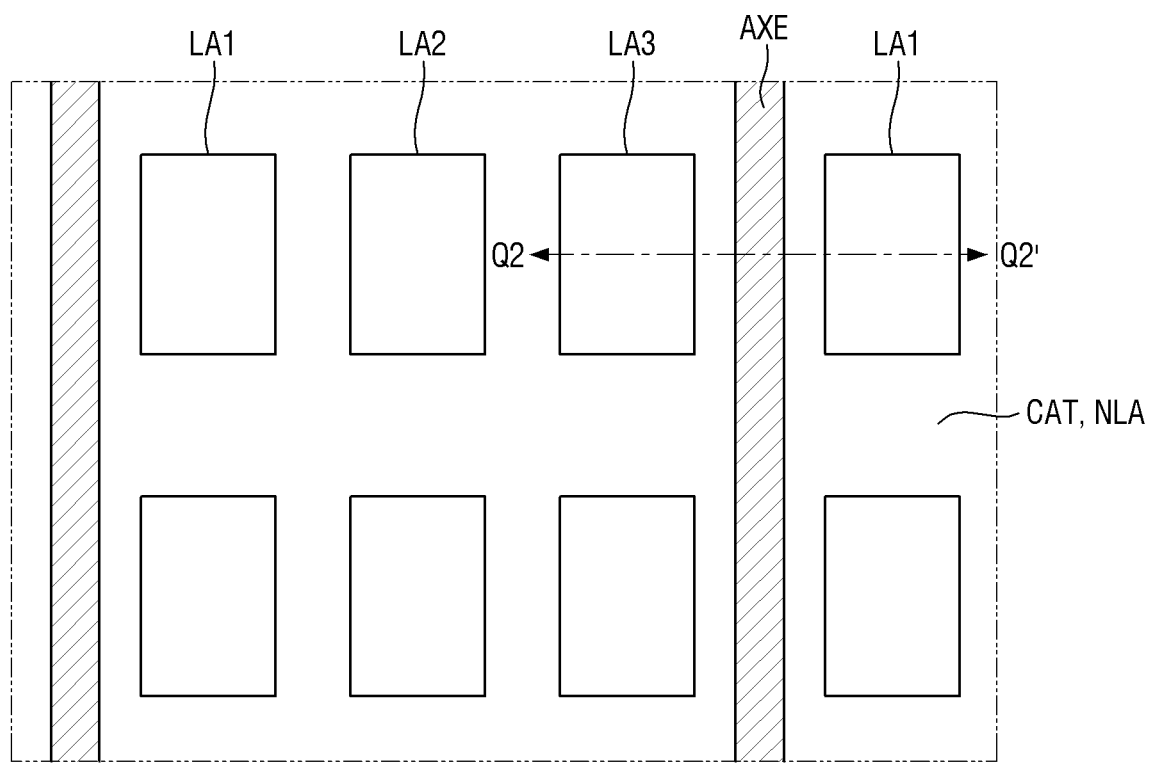
FIG. 6 is a schematic plan view illustrating a layout of multiple pixels of a display device according to an embodiment of the disclosure.
Figure 6:
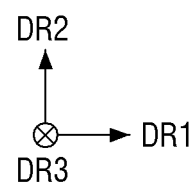
Figure 7:
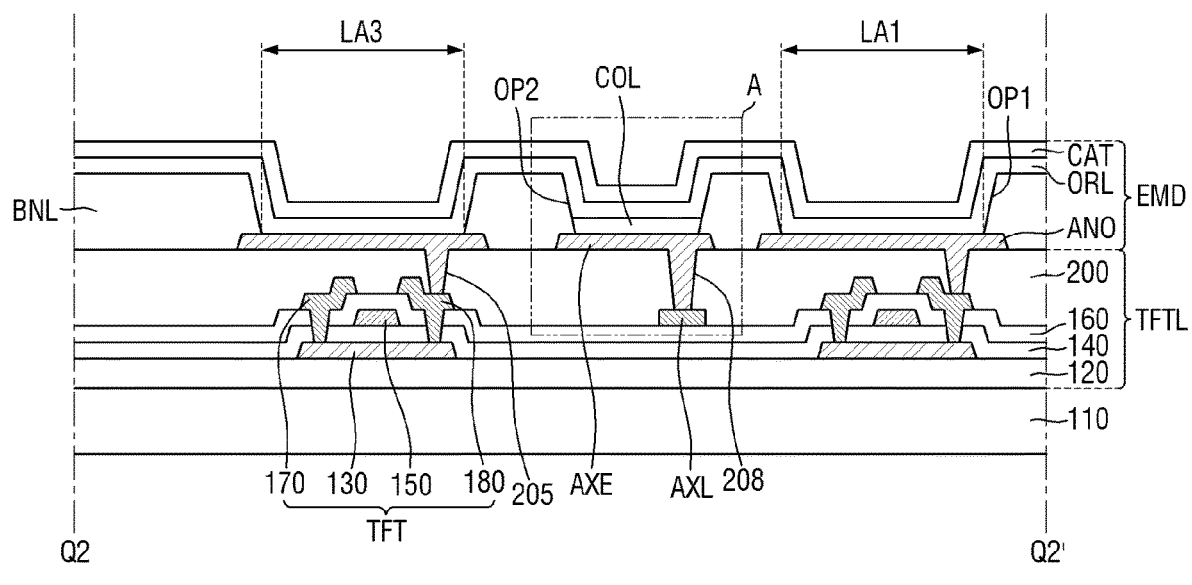
FIG. 7 is a schematic cross-sectional view taken along line Q2-Q2' of FIG. 6.
Figure 7:
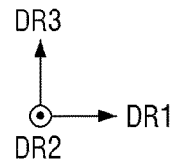
Figure 8:
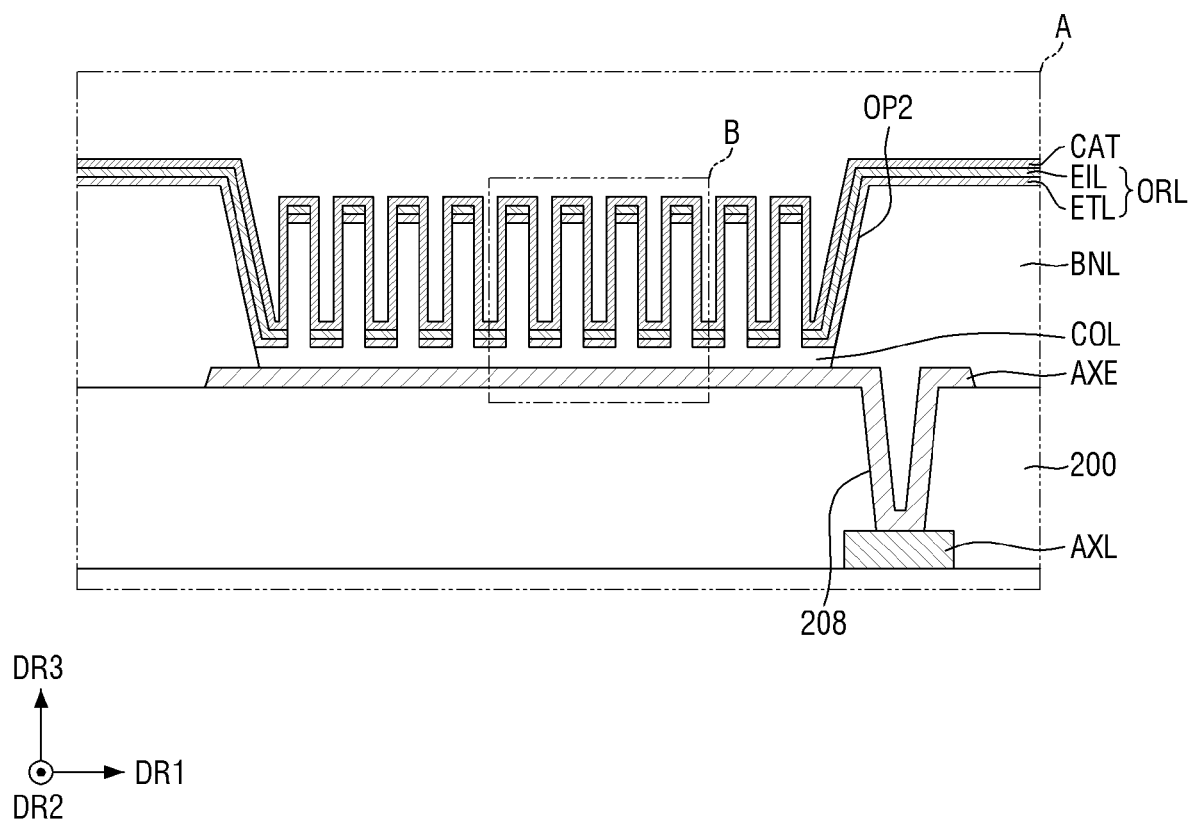
FIG. 8 is an enlarged schematic cross-sectional view illustrating area A of FIG. 7.
Figure 9:
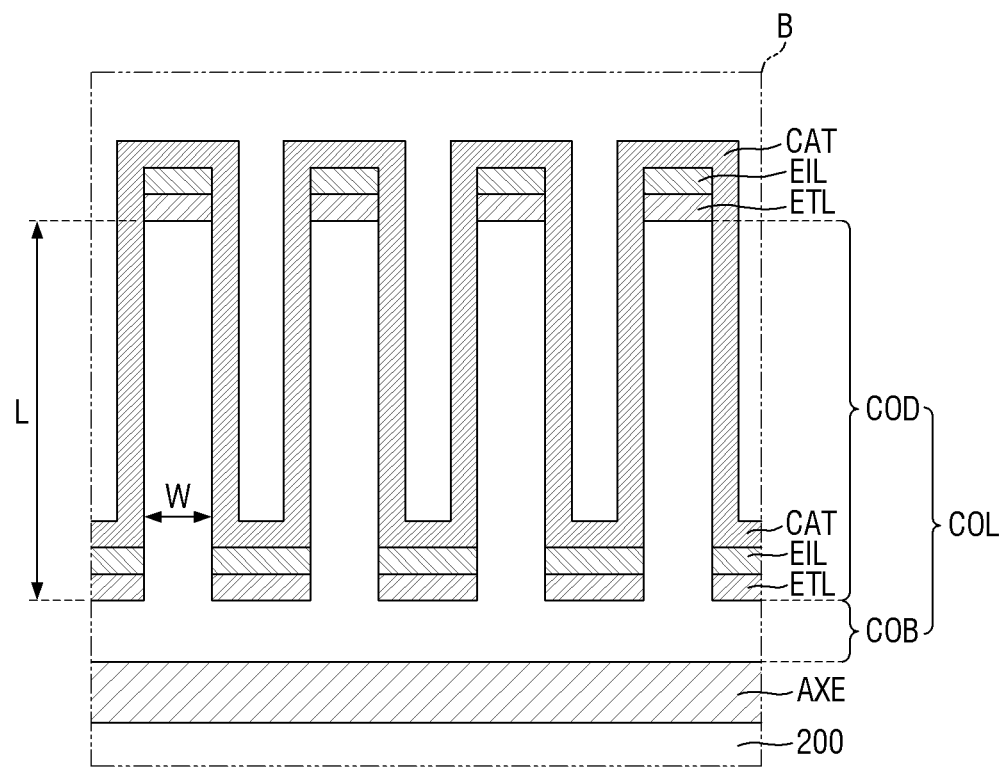
FIG. 9 is an enlarged schematic cross-sectional view illustrating area B of FIG. 8.
Figure 10:
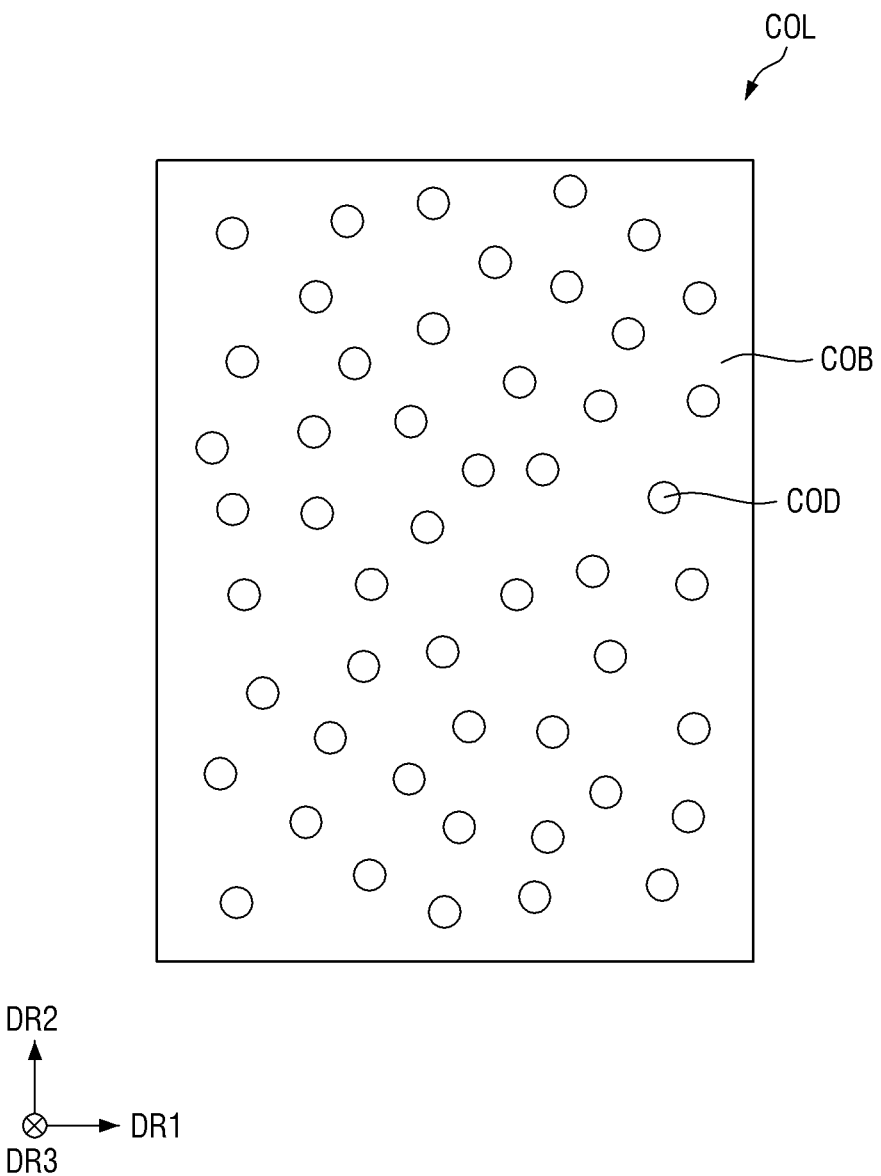
FIG. 10 is a schematic plan view illustrating area A of FIG. 7.
Figure 11:
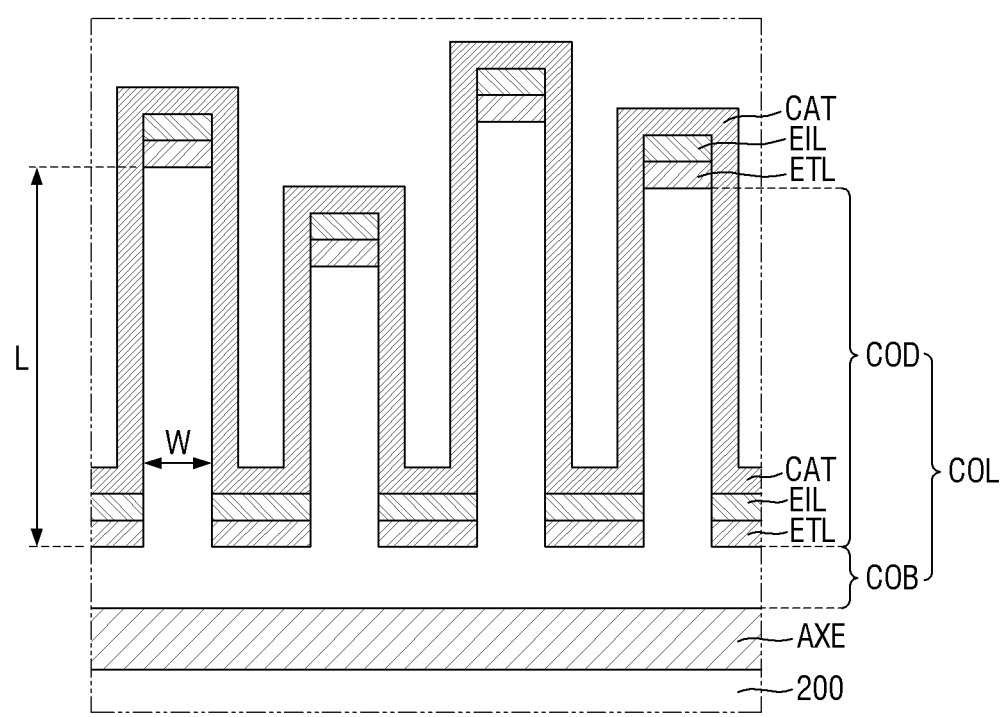
FIGS. 11 to 13 are schematic cross-sectional views illustrating modified examples of a conductive layer according to an embodiment of the disclosure.
Figure 12:
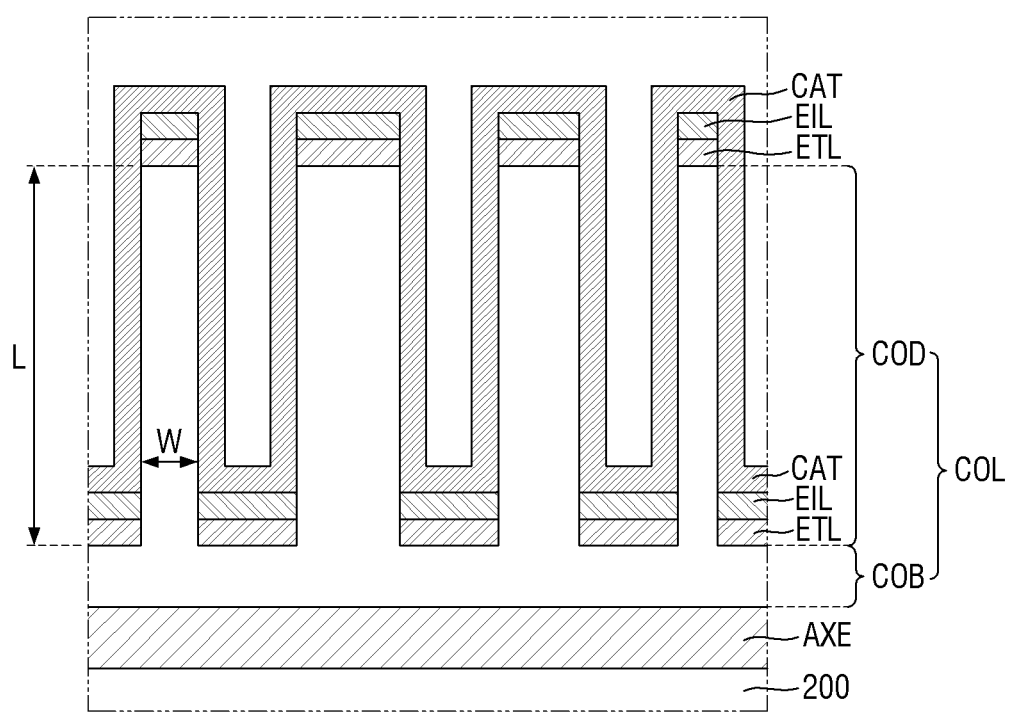
Figure 13:
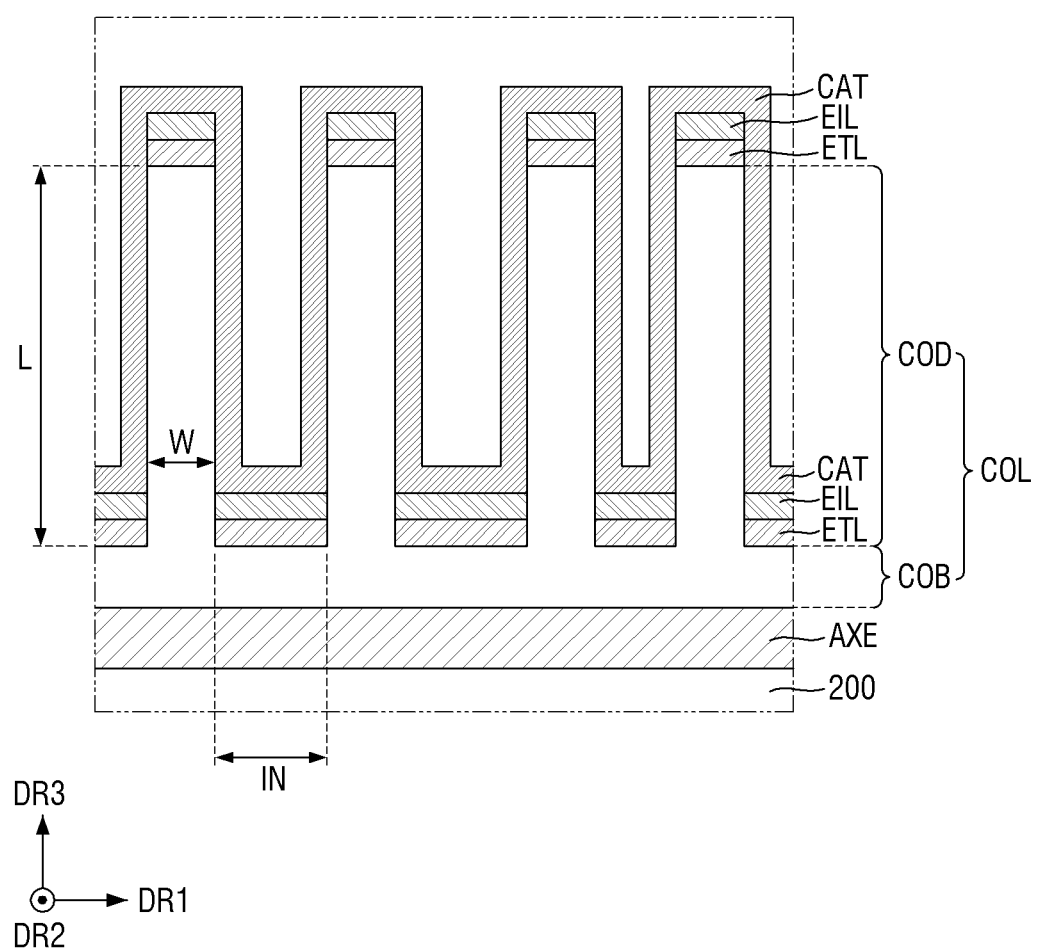

FIG. 6 is a schematic plan view illustrating a layout of multiple pixels of a display device according to an embodiment of the disclosure. FIG. 7 is a schematic cross-sectional view taken along line Q2-Q2' of FIG. 6. FIG. 8 is an enlarged schematic cross-sectional view illustrating area A of FIG. 7. FIG. 9 is an enlarged schematic cross-sectional view illustrating area B of FIG. 8. FIG. 10 is a schematic plan view illustrating area A of FIG. 7. FIGS. 11 to 13 are schematic cross-sectional views illustrating modified examples of a conductive layer according to an embodiment of the disclosure.

Referring to FIG. 6, light emission areas LA1, LA2 and LA3 and a non-light emission area NLA may be disposed on a substrate. The light emission areas LA1, LA2 and LA3 may sequentially be disposed in the first direction DR1, and the same light emission areas may be disposed in the second direction DR2. In an embodiment, the light emission areas LA1, LA2 and LA3 may be disposed in a stripe shape, but are not limited thereto. The light emission areas LA1, LA2 and LA3 may be disposed in various shapes such as a PenTile® shape.

A cathode electrode CAT may be disposed on each of the light emission areas LA1, LA2 and LA3 and the non-light emission area NLA. As described above, the cathode electrode CAT may be disposed entirely on the display area DPA. The cathode electrode CAT may be disposed on the light emission areas LA1, LA2 and LA3 and the non-light emission area NLA.

In an embodiment, an auxiliary electrode AXE may be disposed between the first light emission area LA1 and the third light emission area LA3. The auxiliary electrode AXE may be disposed to be extended in the second direction DR2. The auxiliary electrode AXE may electrically be connected with the cathode electrode CAT to lower resistance of the cathode electrode CAT.

In an embodiment, the auxiliary electrode AXE is shown as being disposed between the first light emission area LA1 and the third light emission area LA3, but is not limited thereto. In some embodiments, the auxiliary electrode AXE may be disposed among the light emission areas LA1, LA2 and LA3. In other embodiments, the auxiliary electrode AXE may be disposed among four light emission areas or more.

Hereinafter, cross-sectional structures of the light emission areas LA1 and LA3 and the auxiliary electrode AXE will be described with reference to the other drawings.

Referring to FIG. 7, the display device 10 according to an embodiment may include a transistor layer TFTL disposed on a substrate 110, and may include a light emitting diode EMD that may include an anode electrode ANO, an organic layer ORL and a cathode electrode CAT. The display device 10 according to an embodiment may further include an auxiliary line AXL, an auxiliary electrode AXE and a conductive layer COL.

In detail, the substrate 110 may be a rigid substrate, or may be a flexible substrate capable of being subjected to bending, folding, rolling or the like. The substrate 110 may be made of an insulating material such as glass, quartz, a polymer resin, or a combination thereof. Examples of the polymer material include polyethersulfone (PES), polyacrylate (PA), polyarylate (PAR), polyetherimide (PEI), polyethylene naphthalate (PEN), polyethyleneterephthalate (PET), polyphenylenesulfide (PPS), polyallate, polyimide (PI), polycarbonate (PC), cellulosetriacetate (CAT), cellulose acetate propionate (CAP) or their combination. The substrate 110 may include a metal material.

The transistor layer TFTL may be disposed on the substrate 110. The transistor layer TFTL may include a transistor TFT, a buffer layer 120, a gate insulating layer 140, an interlayer insulating layer 160, and a planarization layer 200.

The buffer layer 120 may be disposed on the substrate 110. The buffer layer 120 may be disposed on the substrate 110 to protect the transistor TFT and the light emitting diode EMD from moisture permeated through the substrate 110 vulnerable to moisture permeation. The buffer layer 120 may be formed of inorganic layers that may be alternately stacked on each other. For example, the buffer layer 120 may be a multi-layer in which one or more inorganic layers of silicon oxide ($SiO_2$), silicon nitride (SiN) and silicon oxynitride (SiON) may be alternately stacked on each other, but is not limited thereto. The buffer layer 120 may be omitted.

The transistor TFT may be disposed on the buffer layer 120. The transistor TFT may include an active layer 130, a gate electrode 150, a source electrode 170, and a drain electrode 180. In FIG. 7, the transistor TFT may be formed in a top gate type in which the gate electrode 150 may be positioned above the active layer 130, but is not limited thereto. For example, the transistor TFT may be formed in a bottom gate type in which the gate electrode 150 may be positioned below the active layer 130, or a double gate type in which the gate electrode 150 may be positioned above and below the active layer 130.

The active layer 130 may be disposed on the buffer layer 120. The active layer 130 may include polycrystalline silicon, monocrystalline silicon, an oxide semiconductor and the like, or a combination thereof. In case that the active layer 130 includes an oxide semiconductor, the active layer 130 may include multiple conductorized areas and a channel area between the conductorized areas. The oxide semiconductor may be an oxide semiconductor containing indium (In). For example, the oxide semiconductor may be indium-tin-oxide (ITO), indium-zinc-oxide (IZO), indium-gallium oxide (IGO), indium-zinc-tin oxide (IZTO), indium-gallium-tin oxide (IGTO), indium-gallium-zinc-tin oxide (IGZTO), or the like, or a combination thereof.

In another embodiment, the active layer 130 may include polycrystalline silicon. The polycrystalline silicon may be formed by crystallizing amorphous silicon, and the conductorized areas of the active layer 130 may be doped areas doped with impurities, respectively.

A light shielding layer for shielding external light from entering the active layer 130 may further be disposed between the buffer layer 120 and the active layer 130. In case that the light shielding layer is disposed, the light shielding layer may be disposed to overlap the active layer 130, and may be formed of an opaque metal material for blocking transmission of light.

The gate insulating layer 140 may be formed on the active layer 130. The gate insulating layer 140 may be disposed on the buffer layer 120 including the active layer 130. The gate insulating layer 140 may be formed of an inorganic layer that includes, for example, silicon oxide ($SiO_2$), silicon nitride (SiN) and silicon oxynitride (SiON), or may be formed in a stacked structure of silicon oxide ($SiO_2$), silicon nitride (SiN) and silicon oxynitride (SiON).

The gate electrode 150 may be disposed on the gate insulating layer 140. An electrode of a gate line and a storage capacitor may further be disposed on the same layer as the gate electrode 150. The gate electrode 150 may be disposed to overlap the active layer 130 in a thickness direction. The gate electrode 150 may be formed of a single layer or multi-layer made of at least one of molybdenum (Mo), aluminum (Al), chromium (Cr), gold (Au), titanium (Ti), nickel (Ni), neodymium (Nd) and copper (Cu), or their alloy, but is not limited thereto.

The interlayer insulating layer 160 may be disposed on the gate electrode 150. The interlayer insulating layer 160 may function as an insulating layer between the gate electrode 150 and other layers disposed thereon. The interlayer insulating layer 160 may be disposed to cover the gate electrode 150, thereby protecting the gate electrode 150. The interlayer insulating layer 160 may be formed of an inorganic layer that includes an inorganic material such as silicon oxide ($SiO_2$), silicon nitride (SiN) and silicon oxynitride (SiON), or may be formed in a stacked structure of silicon oxide ($SiO_2$), silicon nitride (SiN) and silicon oxynitride (SiON).

The source electrode 170, the drain electrode 180 and the auxiliary line AXL may be disposed on the interlayer insulating layer 160. Each of the source electrode 170 and the drain electrode 180 may be connected to the active layer 130 through contact holes that pass through the gate insulating layer 140 and the interlayer insulating layer 160. The auxiliary line AXL may be disposed between the first light emission area LA1 and the third light emission area LA3, and may be disposed in the non-light emission area NLA. As shown in FIG. 6, the auxiliary line AXL may be disposed to overlap the auxiliary electrode AXE and extended in parallel with the auxiliary electrode AXE. For example, the auxiliary line AXL may be disposed to be extended in the second direction DR2 between the first light emission area LA1 and the third light emission area LA3.

The source electrode 170, the drain electrode 180 and the auxiliary line AXL may be formed of a single layer or multi-layer made of at least one of molybdenum (Mo), aluminum (Al), chromium (Cr), gold (Au), titanium (Ti), nickel (Ni), neodymium (Nd) and copper (Cu), or their alloy, but are not limited thereto. Therefore, the transistor TFT, which includes the active layer 130, the gate electrode 150, the source electrode 170 and the drain electrode 180, may be disposed. Further, the auxiliary line AXL spaced apart from the transistor TFT may be disposed.

The planarization layer 200 for planarizing a step difference due to the transistor TFT and the auxiliary line AXL may be disposed on the source electrode 170, the drain electrode 180 and the auxiliary line AXL. The planarization layer 200 may include a first via hole 205 for connecting the anode electrode ANO to the transistor TFT, and a second via hole 208 for connecting the auxiliary electrode AXL to the auxiliary line AXL. The anode electrode ANO may be connected with the drain electrode 180 of the transistor TFT through the first via hole 205. The auxiliary electrode AXE may be connected with the auxiliary line AXL via the second via hole 208.

The planarization layer 200 may include an organic material such as acrylic resin, epoxy resin, phenolic resin, polyamide resin and polyimide resin to perform a surface planarization function, but is not limited thereto.

A bank layer BNL and the light emitting diode EMD may be disposed on the planarization layer 200. The light emitting diode EMD may include an anode electrode ANO, an organic layer ORL, and a cathode electrode CAT.

The anode electrode ANO may act as a pixel electrode, and may be connected to the drain electrode 180 of the transistor TFT through the first via hole 205. Since the anode electrode ANO has been described above, its description will be omitted The bank layer BNL may be disposed to cover an edge of the anode electrode ANO on the planarization layer 200, thereby partitioning the respective light emission areas. The bank layer BNL may include a first opening OP1 that exposes the anode electrode ANO of a lower portion to define a pixel, i.e., light emission areas. The bank layer BNL may include an organic material such as acrylic resin, epoxy resin, phenolic resin, polyamide resin and polyimide resin to perform a surface planarization function. Also, the bank layer BNL may include or be treated with a material having a liquid repellent property.

The organic layer ORL may be disposed on the anode electrode ANO and the bank layer BNL. As described above, the organic layer ORL may include at least one of a hole injection layer (HIL of FIG. 5), a hole transport layer (HTL of FIG. 5), a light emitting layer (EML of FIG. 5), an electron transport layer (ETL of FIG. 5) or an electron injection layer (EIL of FIG. 5).

In an embodiment, the hole injection layer HIL, the hole transport layer HTL and the light emitting layer EML may be applied to each of the light emission areas LA1, LA2 and LA3 in an inkjet printing manner, and the electron transport layer ETL and the electron injection layer EIL may be formed to be entirely deposited on the display area DPA of the substrate 110. Therefore, the hole injection layer HIL, the hole transport layer HTL, the light emitting layer EML, the electron transport layer ETL and the electron injection layer EIL of the organic layer ORL may overlap the anode electrode ANO exposed by the first opening OP1. The hole injection layer HIL, the hole transport layer HTL and the light emitting layer EML may overlap the anode electrode ANO but may not overlap the bank layer BNL. The electron transport layer ETL and the electron injection layer EIL may overlap the bank layer BNL, but are not limited thereto. The hole injection layer HIL, the hole transport layer HTL and the light emitting layer EML may overlap the bank layer BNL, and the electron transport layer ETL and the electron injection layer EIL may not overlap the bank layer BNL The cathode electrode CAT may be disposed on the organic layer ORL. Since the cathode electrode CAT has been described above, its description will be omitted.

In an embodiment, the bank layer BNL may be disposed on the auxiliary electrode AXE disposed between the first light emission area LA1 and the third light emission area LA3. The bank layer BNL may include a second opening OP2 that exposes the auxiliary electrode AXE. A planar shape of the second opening OP2 may be similar to that of the auxiliary electrode AXE. For example, the planar shape of the second opening OP2 may overlap the auxiliary electrode AXE and may be extended in the second direction DR2 in parallel with the auxiliary electrode AXE, but is not limited thereto. The second opening OP2 may include multiple holes that overlap the auxiliary electrode AXE.

The conductive layer COL may be disposed on the auxiliary electrode AXE exposed by the bank layer BNL.

Referring to FIGS. 8 to 10 in conjunction with FIG. 7, the conductive layer COL may be disposed on the auxiliary electrode AXE. The conductive layer COL may electrically connect the auxiliary electrode AXE with the cathode electrode CAT to lower resistance of the cathode electrode CAT.

The conductive layer COL may include a base portion COB and multiple protrusions COD protruded on the base portion COB.

The base portion COB may be an area that forms a base of the conductive layer COL. The base portion COB may be a seed layer in which the protrusions COD may be grown. The base portion COB may be disposed in direct contact with an upper surface of the auxiliary electrode AXE. The base portion COB may be an area formed of a single layer. The base portion COB may be formed by being applied in the second opening OP2 of the bank layer BNL in an inkjet manner. As a result, a side of the base portion COB may be in contact with a side of the bank layer BNL, may be disposed in the second opening OP2 of the bank layer BNL, and may have an area similar to or substantially the same as that of the second opening OP2.

The protrusions COD may be disposed on the base portion COB, and may be extended in a third direction DR3. The protrusions COD may be formed in a single body with the base portion COB and made of the same material as that of the base portion COB. The protrusions COD may be arranged on the base portion COB randomly in view of a plane. The protrusions COD may be nanorods grown in the third direction DR3 in a random area from a seed of the base portion COB, but are not limited thereto. The protrusions may have a cylindrical shape.

Each of the protrusions COD may have a length L and a width W, which may be extended in the third direction DR3. The length L of each of the protrusions COD may be 500 Å to 1 μm. In case that the length L of each of the protrusions COD may be greater than or equal to 500 Å, a contact area with the cathode electrode CAT may be widened to effectively reduce the resistance of the cathode electrode CAT. In particular, in case that the length L of the protrusion COD is greater than or equal to 500 Å, the protrusion COD may be formed to be higher than a thickness of the electron transport layer ETL and the electron injection layer EIL of the organic layer ORL formed on the protrusion COD, thereby enabling a contact with the cathode electrode CAT. In case that the length L of each of the protrusions COD is less than or equal to 1 μm, the process time required for the growth of the protrusion COD may be shortened and the manufacturing cost may be reduced. In an embodiment, the length L of each of the protrusions COD may be 500 Å to 2000 Å, but is not limited thereto. However, in an embodiment, the maximum length L of the protrusions COD may be lower than a height of the bank layer BNL. The lengths L of the protrusions COD may be equal to each other within the above-described range.

The width W of each of the protrusions COD may be in the range of several tens of Å to several hundreds of Å, and there is no special limitation in the width W of the protrusion COD. However, in case that each of the protrusions COD has a width W that may be less than or equal to several hundreds of Å, since its contact area with the cathode electrode CAT may be increased, the resistance of the cathode electrode CAT may effectively be reduced.

The conductive layer COL may include a material having conductivity. The conductive layer COL may include a metal oxide, and may include, for example, zinc oxide (ZnO) or a metal oxide that includes zinc oxide (ZnO). The zinc oxide (ZnO) may be a material that may be grown at a low temperature, and may be subjected to a low temperature process, but is not limited thereto. Another material may be used as the conductive layer COL if it may be a material capable of being grown at a low temperature, such as zinc oxide (ZnO).

The organic layer ORL may be disposed on the conductive layer COL. In detail, the organic layer ORL may include an electron transport layer ETL and an electron injection layer EIL. As described above, since the electron transport layer ETL and the electron injection layer EIL may be entirely deposited on the display area DPA of the substrate 110, the electron transport layer ETL and the electron injection layer EIL may be disposed on the conductive layer COL.

In detail, the electron transport layer ETL may be disposed directly on the conductive layer COL. The electron transport layer ETL may be in contact with an upper surface of the base portion COB of the conductive layer COL, and may be in contact with an upper surface of the protrusion COD of the conductive layer COL. The electron transport layer ETL may be disposed in contact with a side and an upper surface of the bank layer BNL. The electron transport layer ETL may be disposed between the respective protrusions COD. The electron transport layer ETL may be formed by a deposition method, and may be formed on the upper surface of the base portion COB and the upper surface of the protrusion COD. On the other hand, the electron transport layer ETL may not be disposed on a side of the protrusion COD.

The electron injection layer EIL may be disposed directly on the electron transport layer ETL. The electron injection layer EIL may be formed in a deposition method in the same manner as the electron transport layer ETL and directly formed on the electron transport layer ETL, and may not be disposed on the side of the protrusion COD.

In an embodiment, although the electron transport layer ETL and the electron injection layer EIL are described as examples of the organic layer ORL disposed on the conductive layer COL, the disclosure is not limited thereto. The organic layer ORL disposed on the conductive layer COL may be the electron transport layer ETL or the electron injection layer EIL, or may be one or more of the hole injection layer HIL, the hole transport layer HTL and the light emitting layer EML.

The cathode electrode CAT may be disposed on the organic layer ORL. The cathode electrode CAT may be disposed on the electron injection layer EIL of the organic layer. The cathode electrode CAT may be in direct contact with an upper surface of the electron injection layer EIL and a side of the electron transport layer ETL. The cathode electrode CAT may be formed by a sputtering or deposition method. The cathode electrode CAT may be thicker than the organic layer, and thus may be in contact with the sides of the protrusions COD, respectively. For example, the cathode electrode CAT may electrically be connected with the protrusions COD in contact with the sides of the protrusions COD. Therefore, the cathode electrode CAT may electrically be connected to the auxiliary electrode AXE and the auxiliary line AXL through the conductive layer COL to reduce its resistance.

In the disclosure, the conductive layer COL may be formed between the cathode electrode CAT and the auxiliary electrode AXE. In particular, the conductive layer COL may include the protrusions COD to be directly in contact with the cathode electrode CAT, thereby remarkably increasing the contact area between the cathode electrode CAT and the protrusions COD. As a result, a current path between the cathode electrode CAT and the protrusions COD may be increased to remarkably reduce the resistance of the cathode electrode CAT. Therefore, since the contact area between the cathode electrode CAT and the conductive layer COL may be increased in a limited size on a plane of the auxiliary electrode AXE, the aperture ratio may be prevented from being reduced due to the auxiliary electrode AXE.

The protrusions COD may be formed at their respective lengths, widths and intervals, which may be different from one another.

Referring to FIG. 11, the protrusions COD may have their respective lengths L different from one another. For example, the lengths L of two protrusions COD adjacent to or spaced apart from each other may be different from each other, but are not limited thereto. Some of the protrusions COD may have different lengths L and the others may have the same length L. The widths W of the protrusions COD may be the same as or different from each other.

Referring to FIG. 12, the protrusions COD may have their respective widths W different from one another. For example, the widths W of two protrusions COD adjacent to or spaced apart from each other may be different from each other, but are not limited thereto. Some of the protrusions COD may have different widths W and the others may have the same width W. The lengths L of the protrusions COD may be the same as or different from each other.

Referring to FIG. 13, the protrusions COD may be spaced apart from one another at different intervals IN. For example, an interval IN between two adjacent protrusions COD may be different from an interval IN between the other two adjacent protrusions COD, but the disclosure is not limited thereto. Some of the protrusions COD may be spaced apart from one another at different intervals IN, and the others may be spaced apart from one another at the same interval. The lengths L and the widths W of the protrusions COD may be the same as or different from each other.

Figure 14:
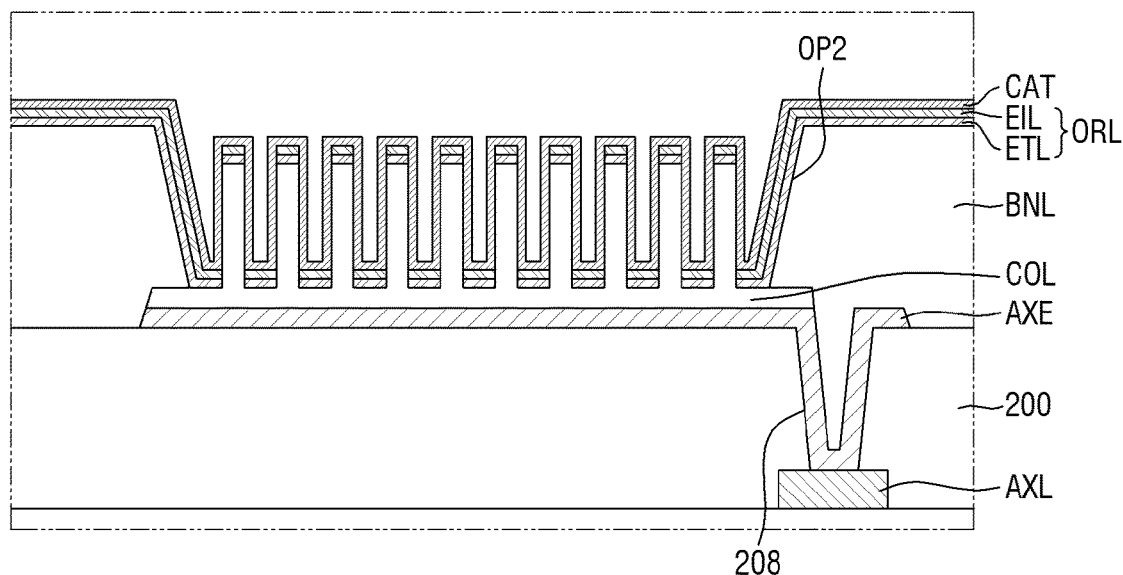
FIG. 14 is a schematic cross-sectional view illustrating a display device according to another embodiment of the disclosure.
Figure 15:
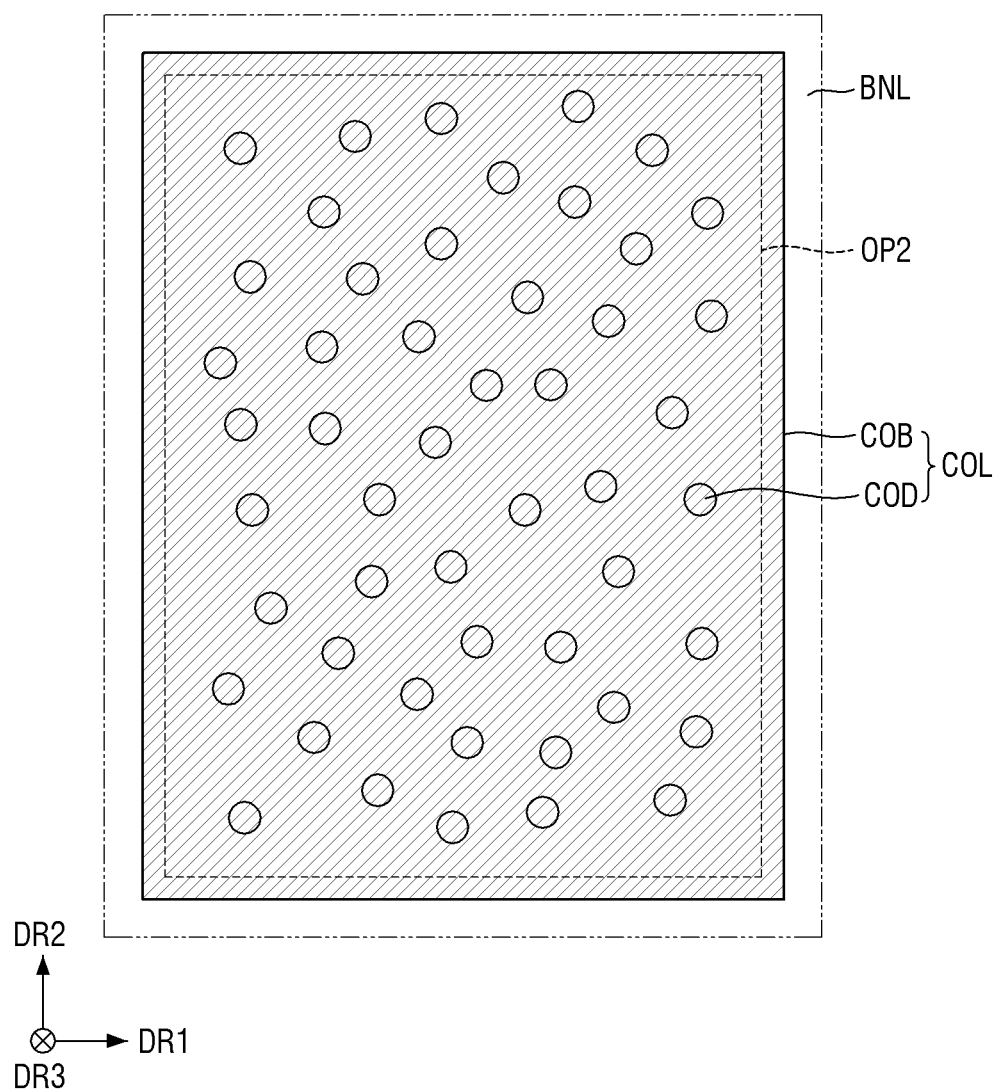
FIG. 15 is a schematic plan view illustrating a conductive layer of a display device according to another embodiment of the disclosure.

FIG. 14 is a schematic cross-sectional view illustrating a display device according to another embodiment of the disclosure. FIG. 15 is a schematic plan view illustrating a conductive layer of a display device according to another embodiment of the disclosure.

Referring to FIGS. 14 and 15, an embodiment may be different from an embodiment of FIGS. 7 to 13 in that the base portion COB of the conductive layer COL may be disposed below the bank layer BNL and partially overlaps the bank layer BNL. Hereinafter, the description of the same elements as those of FIGS. 7 to 13 will be omitted, and a difference from FIGS. 7 to 13 will be described in detail.

The base portion COB of the conductive layer COL may be disposed directly on the auxiliary electrode AXE. At least one side of the base portion COB of the conductive layer COL may be aligned and matched with one side of the auxiliary electrode AXE. Unlike the above-described embodiment, the base portion COB of the conductive layer COL may be formed by a deposition method. For example, a base material may be deposited on the auxiliary electrode AXE and patterned to form the base portion COB. Therefore, the base portion COB may be formed to have a side that may be matched with at least one side of the auxiliary electrode AXE.

Also, at least a portion of the base portion COB of the conductive layer COL may be disposed below the bank layer BNL and covered by the bank layer BNL. For example, the bank layer BNL may cover an edge of the base portion COB. Therefore, at least a portion of the base portion COB may be disposed below the bank layer BNL, and may overlap the bank layer BNL. The base portion COB may overlap the second opening OP2 of the bank layer BNL, and a planar size of the base portion COB may be greater than that of the second opening OP2.

Figure 16:
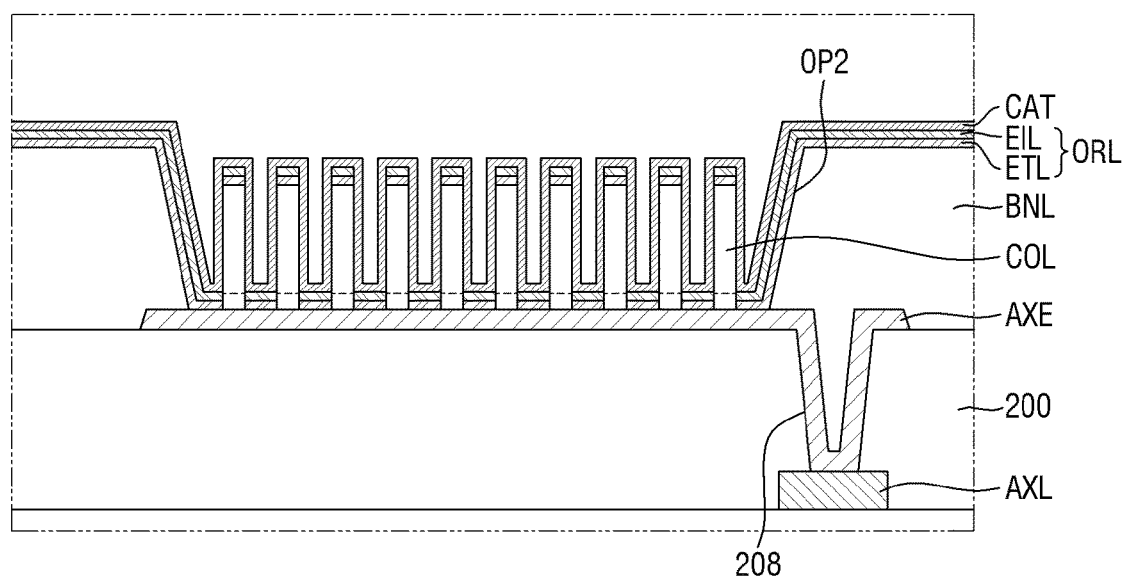
FIG. 16 is a schematic cross-sectional view illustrating a display device according to still another embodiment of the disclosure.
Figure 17:
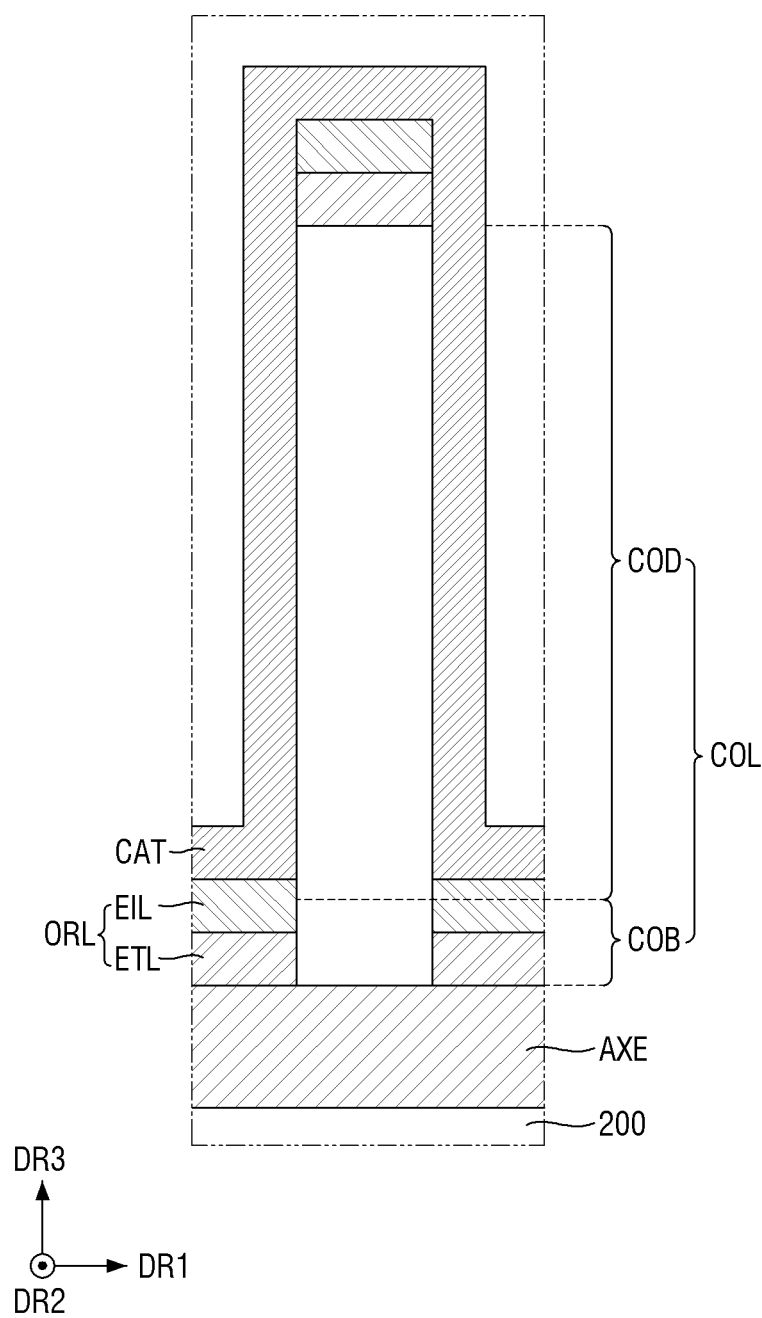
FIG. 17 is a schematic cross-sectional view illustrating a conductive layer of a display device according to still another embodiment of the disclosure.
Figure 18:
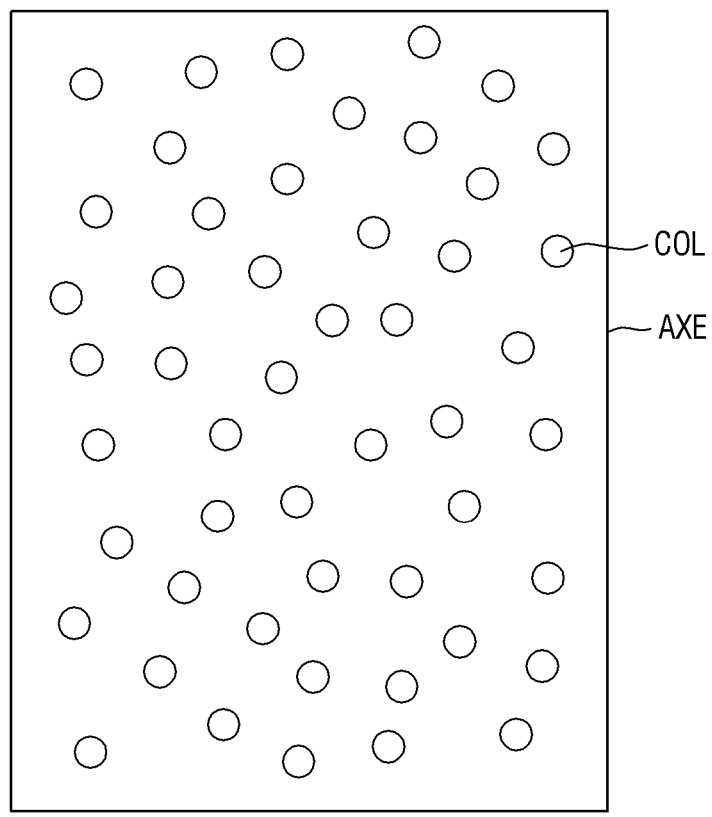
FIG. 18 is a schematic plan view illustrating a conductive layer of a display device according to still another embodiment of the disclosure.
Figure 18:
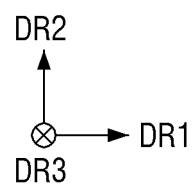

FIG. 16 is a schematic cross-sectional view illustrating a display device according to still another embodiment of the disclosure. FIG. 17 is a schematic cross-sectional view illustrating a conductive layer of a display device according to still another embodiment of the disclosure. FIG. 18 is a schematic plan view illustrating a conductive layer of a display device according to still another embodiment of the disclosure.

Referring to FIGS. 16 to 18, an embodiment may be different from an embodiment of FIGS. 7 to 15 in that the conductive layer COL may be disposed in a dot shape on a plane. Hereinafter, the description of the same elements as those of FIGS. 7 to 15 will be omitted, and a difference from FIGS. 7 to 15 will be described in detail.

The conductive layer COL may be disposed in a dot shape on a plane. In detail, the conductive layer COL may include multiple base portions COB and multiple protrusions COD respectively disposed on the base portions COB. The base portions COB may be disposed on the auxiliary electrode AXE, and may have a planar shape such as a polygonal or circular shape. The base portions COB may regularly be disposed on the auxiliary electrode AXE. The base portion COB may be formed through patterning after being deposited in a deposition manner, and may regularly be disposed, but is not limited thereto. The base portion COB may be patterned randomly and controlled variously. The protrusions COD may be disposed on the base portions COB, respectively. The protruded portions COD may be grown from the base portion COB and formed in a nanorod shape.

The organic layer ORL may be disposed on the auxiliary electrode AXE and the conductive layer COL. The organic layer ORL may be in direct contact with the upper surface of the auxiliary electrode AXE between the conductive layers COL. In detail, the electron transport layer ETL of the organic layer ORL may be in direct contact with the upper surface of the auxiliary electrode AXE, and may be in direct contact with a side and an upper surface of the conductive layer COL. The electron injection layer EIL may be in direct contact with the upper surface of the electron transport layer ETL, and may be in direct contact with the side of the conductive layer COL.

The cathode electrode CAT may be in direct contact with the upper surface and the side of the organic layer ORL, and may be in direct contact with the sides of the conductive layer COL. As the organic layer ORL may be disposed on the auxiliary electrode AXE in the same manner as the base portion COB of the conductive layer COL, the contact area between the cathode electrode CAT and the conductive layer COL may be further increased. Therefore, the resistance of the cathode electrode CAT may be further reduced.

Hereinafter, a method for manufacturing the display device will be described.

FIGS. 19 to 27 are schematic cross-sectional views illustrating process steps of a method for manufacturing a display device according to an embodiment of the disclosure.

FIGS. 19 to 27 may correspond to the third light emission area and the area of the conductive layer of the display device shown in FIG. 7. Since the materials of the respective layers have been described above, their description will be omitted in the following description.

Figure 19:
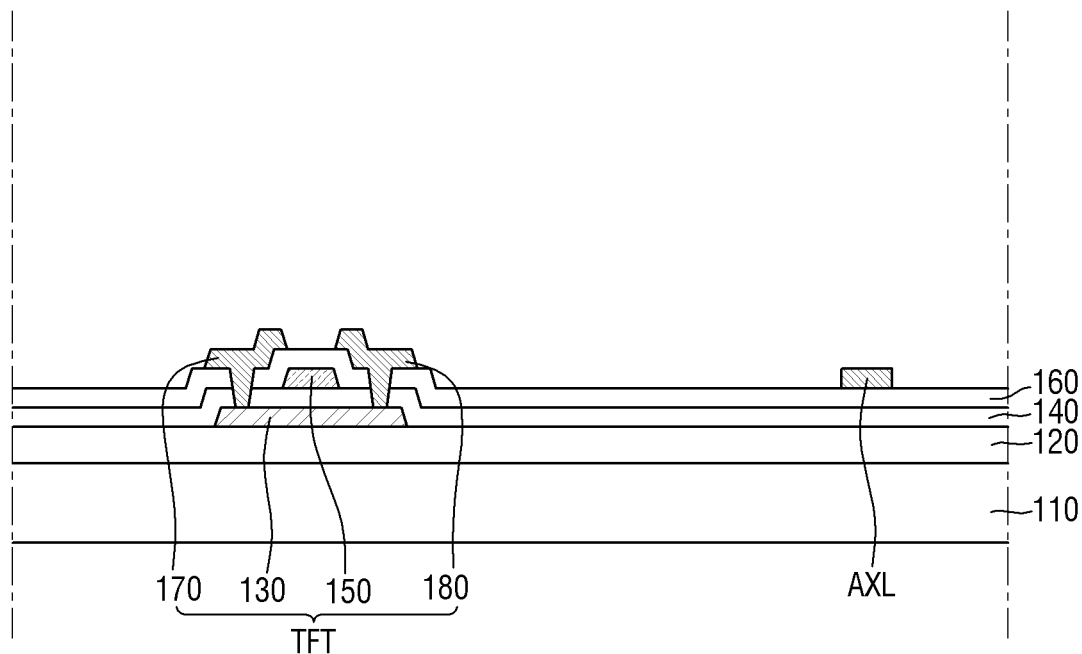
FIGS. 19 to 27 are schematic cross-sectional views illustrating process steps of a method for manufacturing a display device according to an embodiment of the disclosure.

Referring to FIG. 19, a buffer layer 120 may be formed on a substrate 110, and an active layer 130 may be formed on the buffer layer 120. The active layer 130 may be formed by a mask process. For example, an oxide semiconductor or silicon may be deposited entirely on the buffer layer 120 and patterned through a photolithography process to form the active layer 130 as shown in FIG. 19.

A gate insulating layer 140 may be formed on the active layer 130, and a gate electrode 150 overlapped with the active layer 130 may be formed on the gate insulating layer 140. The gate electrode 150 may be formed by a mask process. For example, a gate electrode material layer may be deposited entirely on the gate insulating layer 140. A photoresist layer may be coated on the gate electrode material layer, and a photoresist pattern may be formed through exposure and development. Afterwards, the gate electrode material layer may be etched using the photoresist pattern as an etching mask. The photoresist pattern may be removed through a strip or ashing process to form the gate electrode 150.

An interlayer insulating layer 160 may be formed on the gate electrode 150, and a source electrode 170, a drain electrode 180 and an auxiliary line AXL may be formed on the interlayer insulating layer 160. The source electrode 170, the drain electrode 180 and the auxiliary line AXL may be formed by the mask process described above. Before the source electrode 170, the drain electrode 180 and the auxiliary wiring AXL may be formed, contact holes for exposing the active layer 130 by passing through the interlayer insulating layer 160 and the gate insulating layer 140 may be formed. Afterwards, a source/drain electrode material layer may be deposited entirely on the interlayer insulating layer 160 and patterned through a photolithography process to form the source electrode 170, the drain electrode 180 and the auxiliary line AXL. The source electrode 170 and the drain electrode 180 may be connected to the active layer 130 through the contact holes, respectively. Therefore, a transistor TFT, which includes the active layer 130, the gate electrode 150, the source electrode 170 and the drain electrode 180, may be manufactured.

Figure 20:
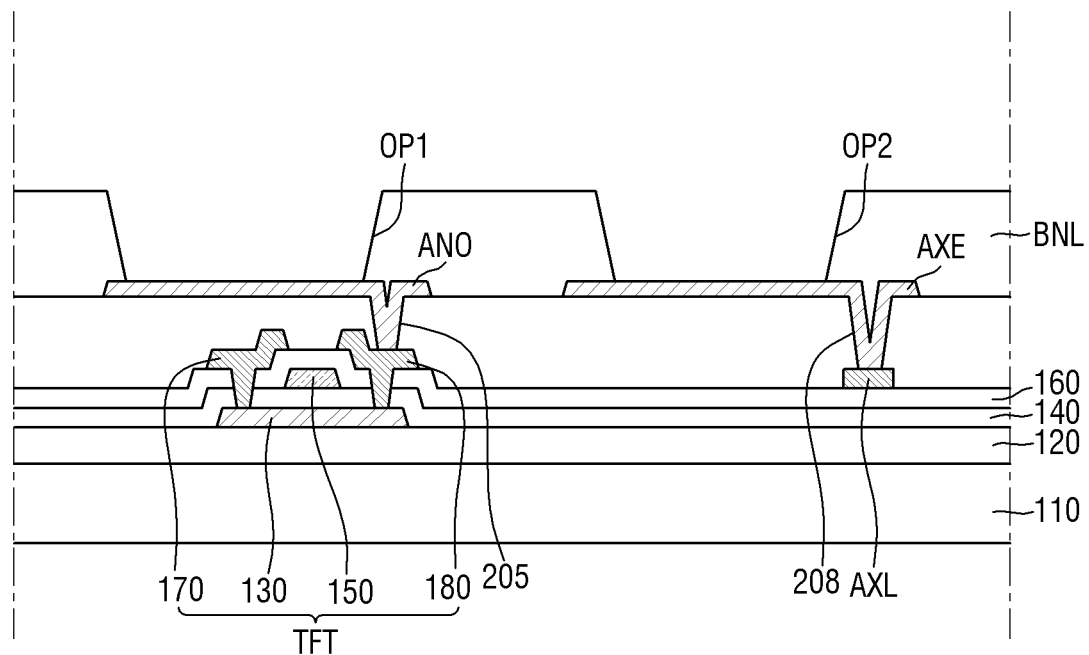

Referring to FIG. 20, a planarization layer 200 may be formed on the source electrode 170, the drain electrode 180 and the auxiliary line AXL. The planarization layer 200 may be formed by coating an organic material with a solution process, for example, a spin coating process. Through a photolithography process, a first via hole 205 for exposing the drain electrode 180 of the thin film transistor TFT may be formed and a second via hole 208 for exposing the auxiliary wiring AXL may be formed.

An anode electrode ANO and an auxiliary electrode AXE may be formed on the planarization layer 200. The anode electrode ANO and the auxiliary electrode AXE may be formed by the mask process described above. In detail, an anode electrode material layer may be deposited entirely on the planarization layer 200 and patterned through a photolithography process to form the anode electrode ANO and the auxiliary electrode AXE. The anode electrode ANO may be connected to the drain electrode 180 of the transistor TFT through the first via hole 205, and the auxiliary electrode AXL may be connected to the auxiliary line AXL through the second via hole 208.

A bank layer material layer may be coated on the substrate 110, a first opening OP1 for exposing the anode electrode ANO may be formed through a photolithography process, and a second opening OP2 for exposing the auxiliary electrode AXE may be formed to form a bank layer BNL.

Figure 21:
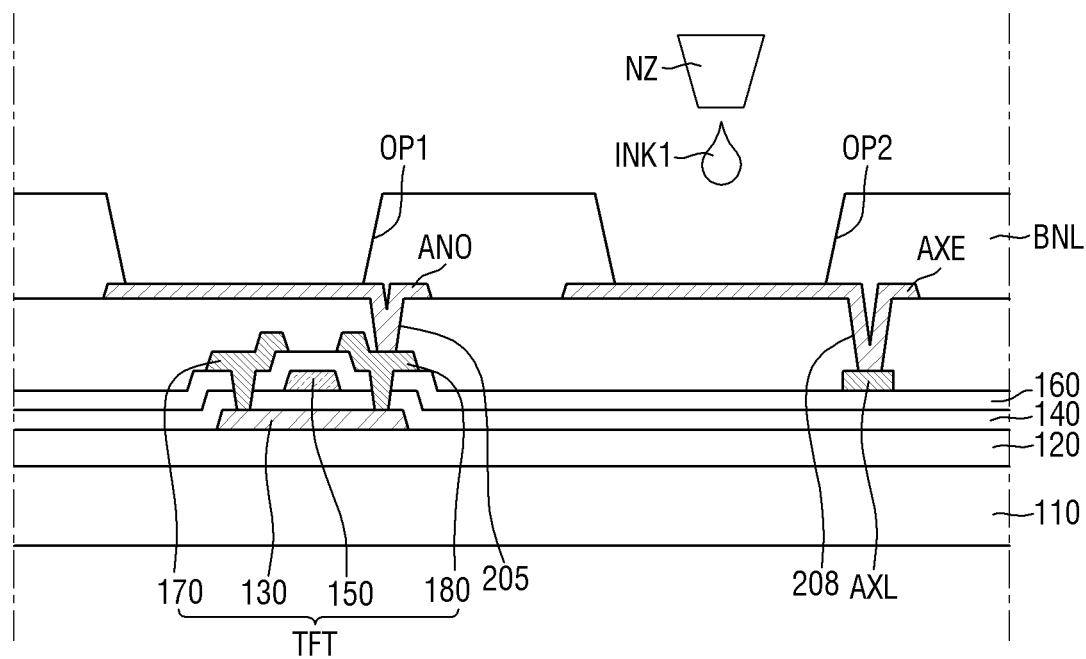
Figure 22:
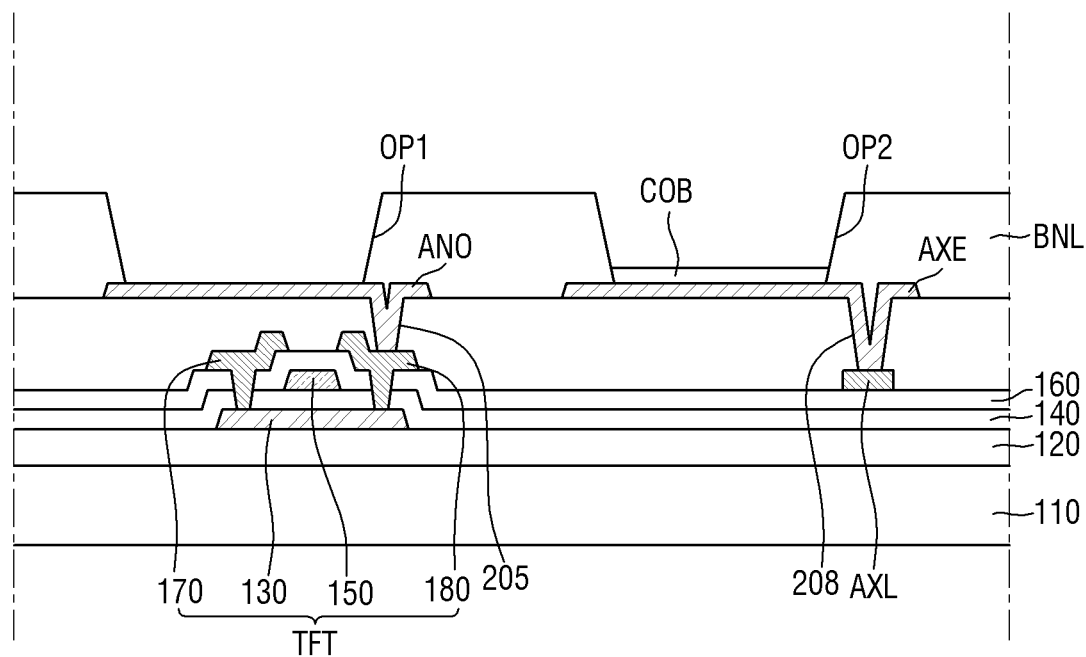

Referring to FIGS. 21 and 22, a seed ink INK1 may be prepared. The seed ink INK1 may be a solution for manufacturing a base portion COB of a conductive layer COL manufactured in a subsequent process. The seed ink INK1 may be a solution for manufacturing a metal oxide, for example, zinc oxide, which constitutes the conductive layer COL.

The seed ink INK1 may be a seed material mixed in a solvent. In an embodiment, the seed ink INK1 may be manufactured by dissolving zinc acetate dihydrate (Zn $(CH_3COO)_2 2H_2O$), which may be a seed material, in isopropanol (IPA), which may be a solvent, and adding monoethanolamine. The manufactured seed ink INK1 may be stirred at a temperature of about 60° for about 20 minutes.

The manufactured seed ink INK1 may be sprayed through an inkjet nozzle NZ in an inkjet method. At this time, the seed ink INK1 may be sprayed onto the second opening OP2 of the bank layer BNL in which the auxiliary electrode AXE may be exposed. After the seed ink INK1 ink may be sprayed, the base portion COB of the conductive layer COL may be manufactured by drying and bake processes. In an embodiment, the drying process may be performed at a temperature of about 150° C. for about 10 minutes, and the bake process may be performed at a temperature of about 500° C. for about 2 hours. However, the disclosure is not limited to this example.

Figure 23:
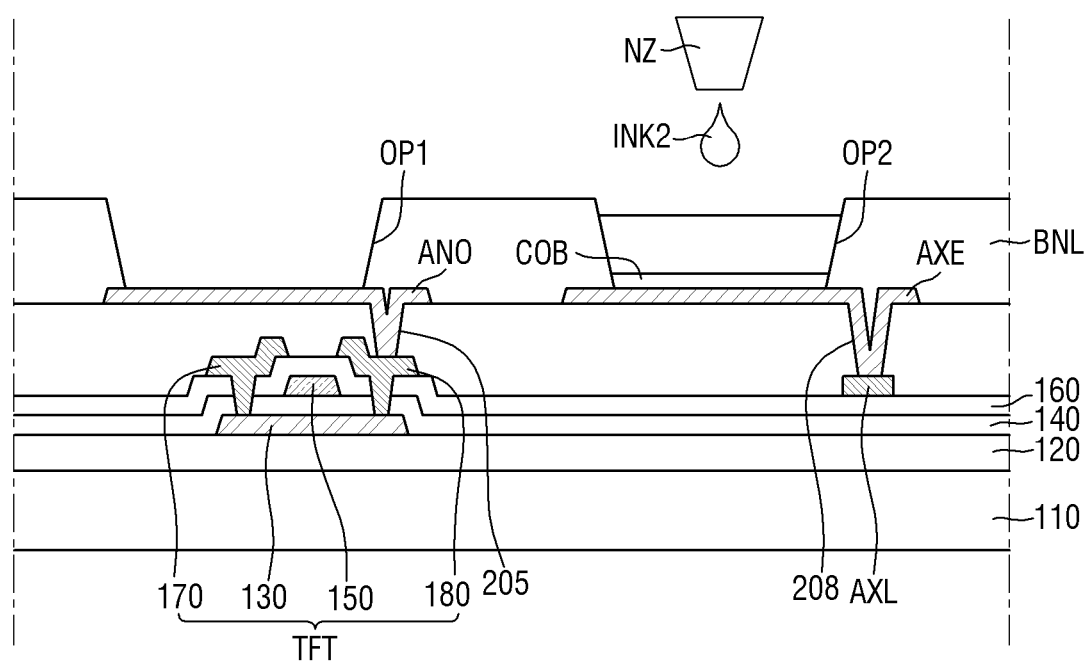
Figure 24:
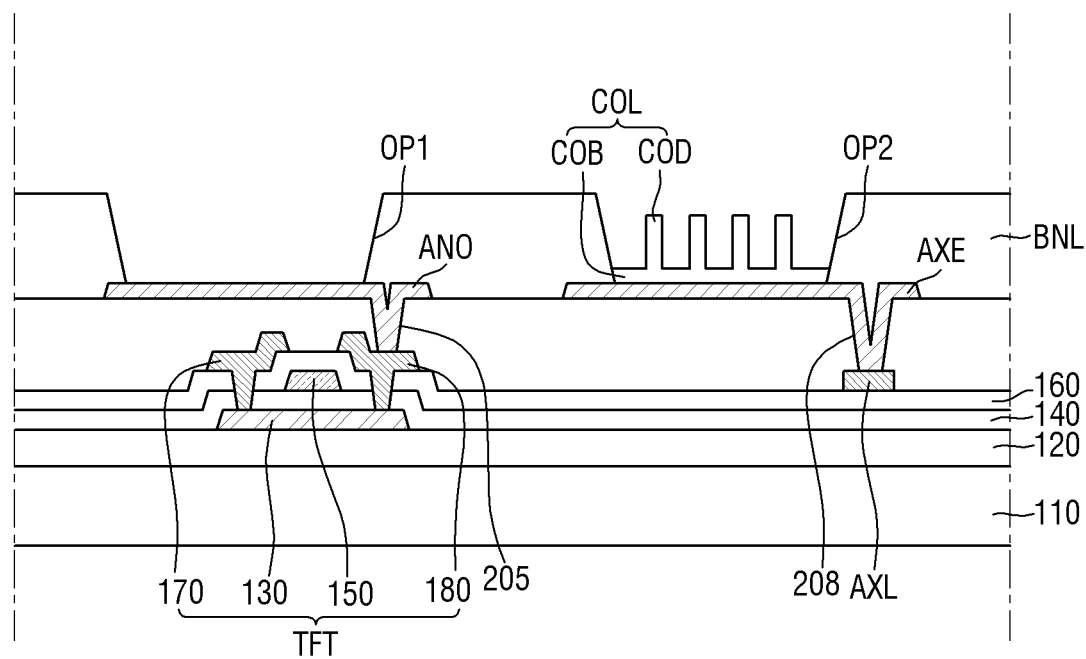

Referring to FIGS. 23 and 24, a precursor ink INK2 may be sprayed onto the second opening OP2 of the bank layer BNL in which the base portion COB of the conductive layer COL may be formed. The precursor ink INK2 may be for growing protrusions COD from a metal oxide seed of the base portion COB. In an embodiment, the precursor ink INK2 may be manufactured by dissolving zinc nitrate hexahydrate $(Zn(NO_3)_2 6H_2O)$ in DI water, which may be a solvent, and adding hexamethylene.

The manufactured precursor ink INK2 may be sprayed onto the base portion COB of the conductive layer COL through the inkjet nozzle NZ. In case that the precursor ink INK2 may be sprayed, the seed of the base portion COB may be grown in the third direction DR3 by being reacted with the precursor ink INK2 to form the protrusions COD. A height and width of the protrusions COD may be adjusted by adjusting the reaction time with the precursor ink INK2. In an embodiment, the reaction process may be performed at a temperature of about 90°. In case that the protrusion is grown to a desired height, drying and bake processes may be performed to remove the precursor ink INK2, whereby the reaction may be terminated. Therefore, the conductive layer COL, which includes the base portion COB and the protrusions COD, may be formed.

Figure 25:
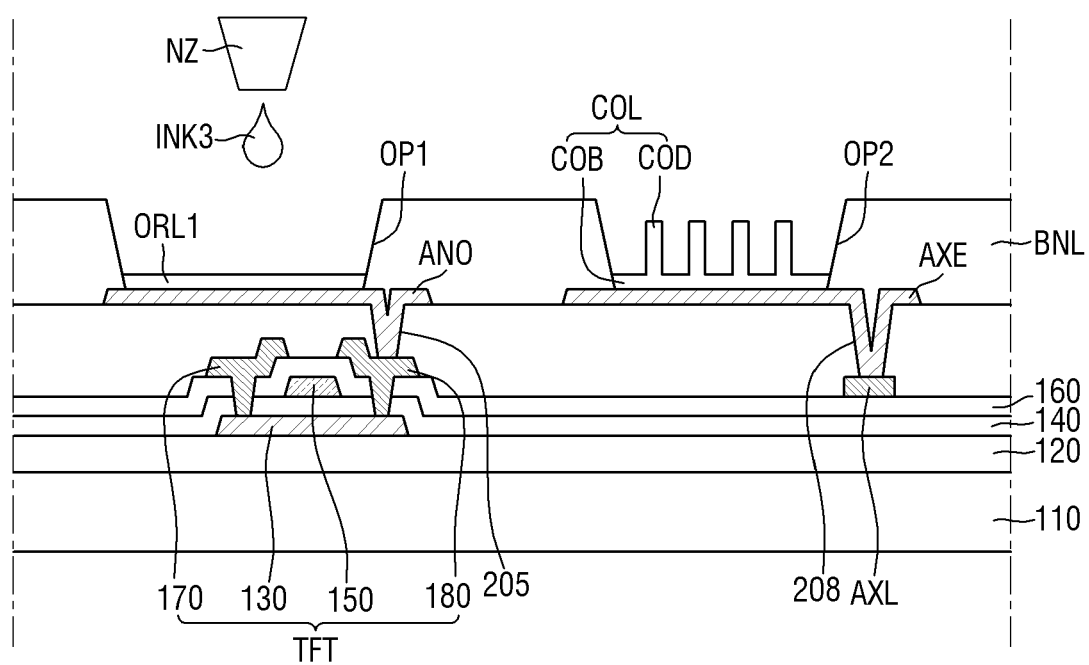

Referring to FIG. 25, a first organic layer ORL1 may be formed on the first opening OP1 of the bank layer BNL in which the anode electrode ANO may be exposed. The first organic layer ORL1 may be manufactured by spraying a first organic layer ink INK3 through the nozzle NZ by using the inkjet method. At this time, the first organic layer ORL1 may be a hole injection layer, a hole transport layer and a light emitting layer. Each of the hole injection layer, the hole transport layer and the light emitting layer may be made of ink and sprayed, and may be manufactured by drying and bake processes.

Figure 26:
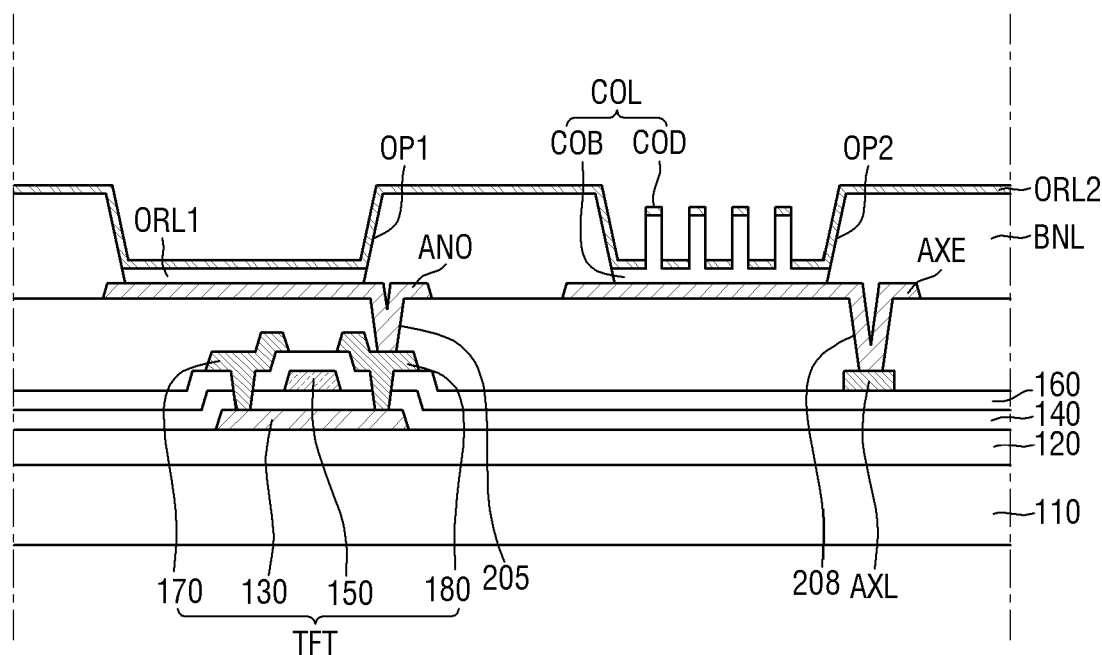
Figure 26:
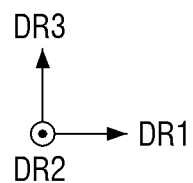

Referring to FIG. 26, a second organic layer ORL2 may be formed on the entire surface of the substrate 110. The second organic layer ORL2 may be deposited on the entire surface of the substrate 110 by using a deposition method. At this time, the second organic layer ORL2 may be an electron transport layer and an electron injection layer. The electron transport layer and the electron injection layer may sequentially be stacked on each other through a deposition method. The second organic layer ORL2 may be stacked on the first organic layer ORL1, the bank layer BNL and the conductive layer COL. In particular, the second organic layer ORL2 may be stacked on the upper surface of the base portion COB of the conductive layer COL and the upper surface of the protrusion COD.

Figure 27:
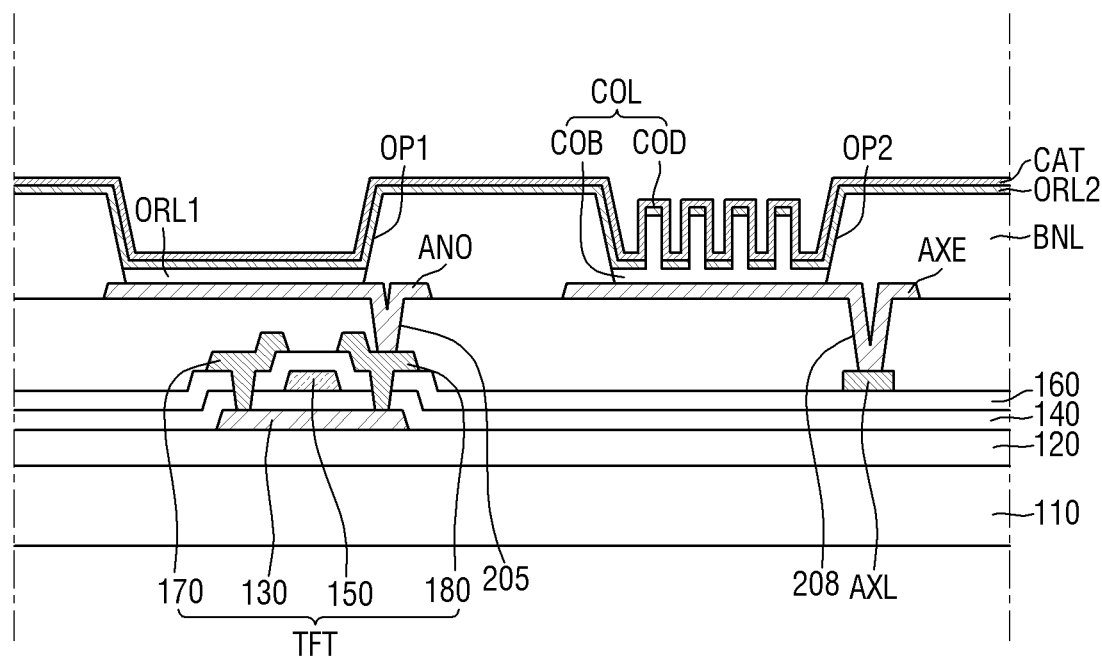

Referring to FIG. 27, a cathode electrode CAT may be formed on the entire surface of the substrate 110. The cathode electrode CAT may be deposited on the entire surface of the substrate 110 by using a deposition method. The cathode electrode CAT may be stacked on the second organic layer ORL2, and may be in direct contact with a side of the protrusion COD of the conductive layer COL. Therefore, the display device according to an embodiment may be manufactured.

As described above, in the method for manufacturing the display device according to an embodiment of the disclosure, the protrusions COD may be grown on the auxiliary electrode AXE to form the conductive layer COL, whereby the contact area between the cathode electrode CAT and the conductive layer COL may be increased to lower the resistance of the cathode electrode CAT and solve the voltage drop problem.

In order to electrically connect the auxiliary electrode AXE with the cathode electrode CAT, the process for removing the organic layer ORL1 and ORL2 may be omitted.

Figure 28:
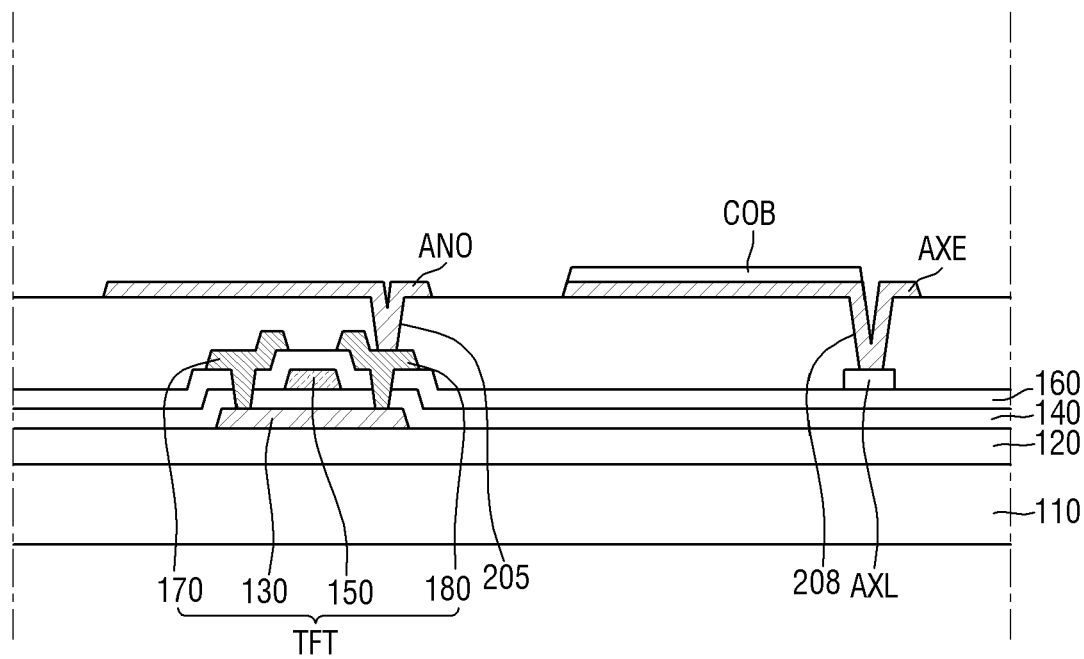
FIGS. 28 and 29 are schematic cross-sectional views illustrating process steps of a method for manufacturing a display device according to another embodiment of the disclosure.
Figure 28:
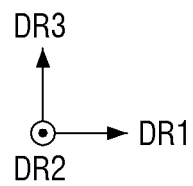
Figure 29:
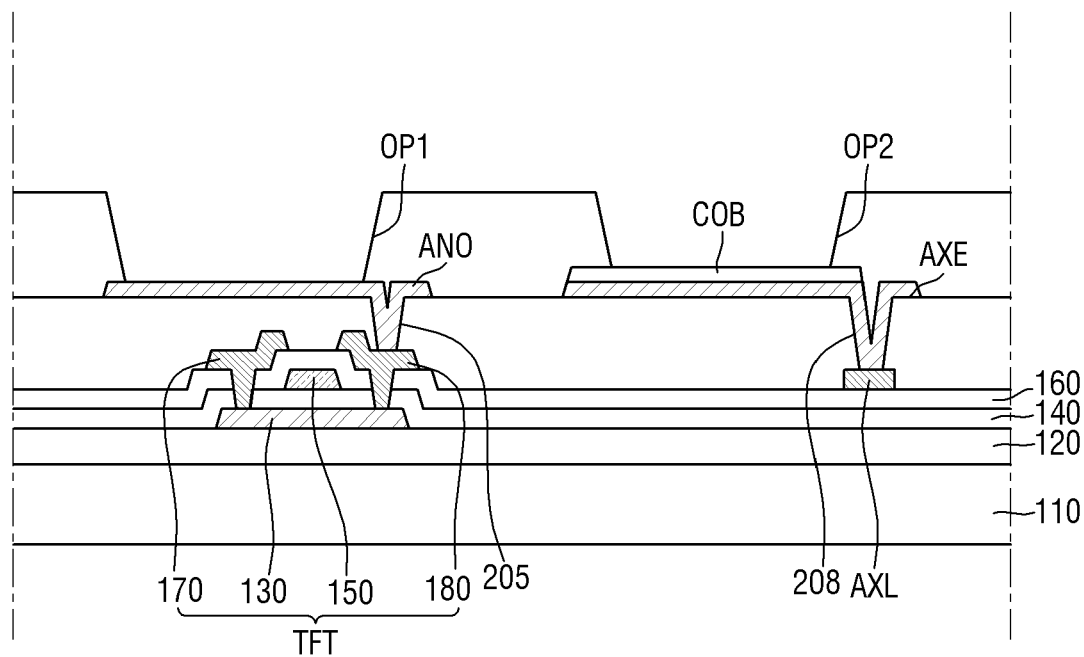

FIGS. 28 and 29 are schematic cross-sectional views illustrating process steps of a method for manufacturing a display device according to another embodiment of the disclosure.

FIGS. 28 and 29 illustrate some processes for manufacturing the structure of FIG. 14, and since the other processes may be the same as those of the aforementioned embodiment, and their description will be omitted.

Referring to FIG. 28, an anode electrode ANO and an auxiliary electrode AXE may be formed on the planarization layer 200 in the same manner as FIG. 20. A metal oxide may be deposited on the auxiliary electrode AXE and patterned by a photolithography method to form a base portion COB of a conductive layer COL. The base portion COB may be formed to be aligned and matched with at least one side of the anode electrode ANO.

Referring to FIG. 29, a bank layer material may be coated on the substrate 110 and patterned to form a first opening OP1 for exposing the anode electrode ANO and a second opening OP2 for exposing the base portion COB of the conductive layer COL. A bank layer BNL may be formed to cover an edge of the base portion COB of the conductive layer COL.

The display device according to another embodiment may be manufactured by the processes of FIGS. 21 to 27.

In an embodiment, the base portion CB may be formed by the deposition method, whereby the shape of the conductive layer COL may be adjusted variously. Therefore, the arrangement of the protrusions COD grown on the base portion COB may be adjusted, whereby the voltage drop problem of the cathode electrode CAT may be solved effectively.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
    an auxiliary electrode disposed on a substrate;
    a bank layer disposed on the auxiliary electrode;
    a conductive layer disposed on the auxiliary electrode, the conductive layer including a base portion and protrusions protruded from the base portion;
    an organic layer disposed on the conductive layer; and
    a cathode electrode disposed on the organic layer, the cathode electrode being in contact with the protrusions,
    wherein the organic layer includes at least one of an electron transport layer and an electron injection layer.

2. The display device of claim 1, wherein
    the base portion is extended in a first direction parallel to the substrate, and
    the protrusions are extended in a second direction intersecting the first direction.

3. The display device of claim 1, wherein the protrusions are in a rod shape.

4. The display device of claim 1, wherein
    the base portion and the protrusions are in a single body, and
    the base portion and the protrusions include a same material.

5. The display device of claim 4, wherein the base portion and the protrusions include zinc oxide.

6. The display device of claim 1, wherein
    a length of the protrusions is about 500 Å or more, and
    the length of the protrusions is smaller than a thickness of the bank layer.

7. The display device of claim 1, wherein the protrusions are randomly disposed in a plan view.

8. The display device of claim 7, wherein the organic layer is in contact with an upper surface of each of the base portion and the protrusions.

9. The display device of claim 7, wherein the cathode electrode is in contact with sides of the protrusions.

10. The display device of claim 7, wherein
    the bank layer includes an opening that exposes the auxiliary electrode, and
    the conductive layer is disposed in the opening.

11. The display device of claim 7, wherein
    at least a portion of the base portion is disposed below the bank layer, and
    at least a portion of the base portion overlaps the bank layer in a plan view.

12. The display device of claim 7, wherein the conductive layer is disposed in dot shapes in a plan view.

13. A display device comprising:
    an anode electrode disposed on a light emission area of a substrate and an auxiliary electrode disposed on a non-light emission area of the substrate;
    a bank layer disposed on the anode electrode and the auxiliary electrode;
    a conductive layer disposed on the auxiliary electrode, the conductive layer including a base portion and protrusions protruded from the base portion;
    an organic layer disposed on the anode electrode and the conductive layer; and
    a cathode electrode disposed on the organic layer, the cathode electrode being in contact with the protrusions,
    wherein
    the anode electrode and the auxiliary electrode are disposed on a same layer, and
    the anode electrode and the auxiliary electrode include a same material.

14. The display device of claim 13, wherein
    the organic layer includes:
        a hole injection layer;
        a hole transport layer;
        a light emitting layer;
        an electron transport layer; and
        an electron injection layer,
    the hole injection layer, the hole transport layer, the light emitting layer, the electron transport layer, and the electron injection layer overlap the anode electrode in a plan view,
    the hole injection layer, the hole transport layer, and the light emitting layer do not overlap the conductive layer in a plan view, and
    the electron transport layer and the electron injection layer overlap the conductive layer in a plan view.

15. The display device of claim 13, wherein
    the base portion and the protrusions are in a single body, and
    the cathode electrode is in contact with sides of the protrusions.

* * * * *